US007855798B2

(12) United States Patent
Toyoda

(10) Patent No.: US 7,855,798 B2
(45) Date of Patent: Dec. 21, 2010

(54) PRINTING SYSTEM, IMAGE FORMING DEVICE, PRINTING CONTROL METHOD AND PRINTING CONTROL PROGRAM

(75) Inventor: Masashi Toyoda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1188 days.

(21) Appl. No.: 11/490,965

(22) Filed: Jul. 20, 2006

(65) Prior Publication Data

US 2007/0024655 A1 Feb. 1, 2007

(30) Foreign Application Priority Data

Jul. 29, 2005 (JP) ............................ 2005-220669
Dec. 13, 2005 (JP) ............................ 2005-358949
Dec. 13, 2005 (JP) ............................ 2005-358966

(51) Int. Cl.
*G06F 3/12* (2006.01)
*G03F 3/08* (2006.01)
*H04N 1/46* (2006.01)

(52) U.S. Cl. .................... 358/1.15; 358/520; 358/1.13; 358/514

(58) Field of Classification Search .................. 347/23; 399/33, 29, 9; 365/189.05; 358/1.15
See application file for complete search history.

(56) References Cited

U.S. PATENT DOCUMENTS 5,325,209 A * 6/1994 Manabe ...................... 358/437
5,768,654 A * 6/1998 Noguchi et al. ............... 399/69
6,493,100 B1 * 12/2002 Endo et al. ................. 358/1.14
7,054,022 B2 * 5/2006 Kazama et al. ............ 358/1.15
7,149,439 B2 * 12/2006 Hirata et al. .................. 399/29
7,243,045 B2 * 7/2007 Uwatoko et al. ............... 399/9
2003/0122891 A1 * 7/2003 Hamamoto et al. ........... 347/23
2004/0252324 A1 * 12/2004 Ohta ......................... 358/1.14
2005/0095021 A1 * 5/2005 Fujiwara ...................... 399/33
2006/0062053 A1 * 3/2006 Taniguchi et al. ...... 365/189.05

FOREIGN PATENT DOCUMENTS

JP 60-076759 5/1985
JP 11-038861 2/1999
JP 11194911 A 7/1999
JP 2000-261748 9/2000
JP 2003-186373 7/2003
JP 2004-220565 8/2004
JP 2005-165036 6/2005

* cited by examiner

*Primary Examiner*—King Y Poon
*Assistant Examiner*—Akwasi M Sarpong
(74) *Attorney, Agent, or Firm*—Edwards Angell Palmer & Dodge LLP; David G. Conlin; David A. Tucker

(57) ABSTRACT

More than one image forming devices (such as printer, copier, facsimile, etc.) which provide detecting means of environmental conditions (such as a temperature and/or humidity sensor) and sending means of the information of the said detected conditions and a print server are connected through a network. The print server judges the environmental situation of each device, selects the devices which are good for operation and sends the respective print data to the selected devices according to the said judgment. In this printing system the environmental conditions of image forming devices are judged uniformly and in highly reliable manner in order to avoid printing from the devices which are in dew condensation and/or waiting for the devices becoming ready to operate so that a large volume of printing matters can be printed in the minimum interval.

6 Claims, 36 Drawing Sheets

| UNIT NAME | POWER SUPPLY | BEDEWING HISTORY | TIME PASSAGE FROM START OF READY (OK FOR 10 MINUTES OR LONGER) | TIME PASSAGE IN STATE OF LEFT ALONE UNDER TEMPERATURE/HUMIDITY OTHER THAN BEDEWING CONDITION (OK FOR 45 MINUTES OR LONGER) | DEHUMIDIFIERS (HEATER/FAN) HAVE OR HAVE NOT STARTED | DEHUMIDIFIERS OPERATING TIME (OK FOR 10 MINUTES OR LONGER) | BEDEWING |
|---|---|---|---|---|---|---|---|
| MFP1 | READY | YES | 20 MINUTES | 30 MINUTES | YES | 20 MINUTES | NO |
| MFP2 | STAND-BY | YES | – | 50 MINUTES | NO | – | NO |
| MFP3 | OFF | – | – | - | – | – | UNKNOWN |
| MFP4 | STAND-BY | YES | – | 20 MINUTES | NO | – | YES |
| MFP5 | STAND-BY | YES | – | 25 MINUTES | YES | 10 MINUTES | NO |
| MFP6 | READY | YES | 3 MINUTES | 10 MINUTES | YES | 3 MINUTES | YES |
| MFP7 | STAND-BY | YES | – | 25 MINUTES | YES | 3 MINUTES | YES |
| MFP8 | STAND-BY | NO | – | 1 HOUR OR LONGER | NO | – | NO |

READY :POWER IS ON WITH TEMPERATURE CONTROL
STAND-BY:POWER IS ON WITHOUT TEMPERATURE CONTROL

FIG. 9A

| UNIT NAME | POWER SUPPLY | BEDEWING HISTORY | TIME PASSAGE FROM START OF READY (OK FOR 10 MINUTES OR LONGER) | TIME PASSAGE IN STATE OF LEFT ALONE UNDER TEMPERATURE/HUMIDITY OTHER THAN BEDEWING CONDITION (OK FOR 45 MINUTES OR LONGER) | DEHUMIDIFIERS (HEATER/FAN) HAVE OR HAVE NOT STARTED | DEHUMIDIFIERS OPERATING TIME (OK FOR 10 MINUTES OR LONGER) | BEDEWING |
|---|---|---|---|---|---|---|---|
| MFP1 | READY | YES | 20 MINUTES | 30 MINUTES | YES | 20 MINUTES | NO |
| MFP2 | STAND-BY | YES | — | 50 MINUTES | NO | — | NO |
| MFP3 | OFF | — | — | - | — | — | UNKNOWN |
| MFP4 | STAND-BY | YES | — | 20 MINUTES | NO | — | YES |
| MFP5 | STAND-BY | YES | — | 25 MINUTES | YES | 10 MINUTES | NO |
| MFP6 | READY | YES | 3 MINUTES | 10 MINUTES | YES | 3 MINUTES | YES |
| MFP7 | STAND-BY | YES | — | 25 MINUTES | YES | 3 MINUTES | YES |
| MFP8 | STAND-BY | NO | — | 1 HOUR OR LONGER | NO | — | NO |

READY : POWER IS ON WITH TEMPERATURE CONTROL
STAND-BY : POWER IS ON WITHOUT TEMPERATURE CONTROL

FIG. 9B

| UNIT NAME | GROUP | POWER SUPPLY | BEDEWING HISTORY | TIME PASSAGE IN STATE OF LEFT ALONE | DEHUMIDIFIERS HAVE OR HAVE NOT STARTED | BEDEWING |
|---|---|---|---|---|---|---|
| MFP1 | 1 | READY | YES | 30 MINUTES | YES | NO |
| MFP2 | 2 | STAND-BY | YES | 50 MINUTES | NO | NO |
| MFP3 | 2 | OFF | — | — | — | NO |
| MFP4 | 3 | STAND-BY | YES | 20 MINUTES | NO | YES |
| MFP5 | 3 | STAND-BY | YES | 25 MINUTES | YES | NO |
| MFP6 | 4 | READY | YES | 10 MINUTES | YES | YES |
| MFP7 | 5 | STAND-BY | YES | 25 MINUTES | YES | YES |
| MFP8 | 6 | STAND-BY | NO | 1 HOUR OR LONGER | NO | NO |

FIG. 21A

■CONTROL OVER EACH MFP

| UNIT NAME | TEMPERATURE (°C) | HUMIDITY (%) | FIRST TOTAL PERIOD (h) | SECOND TOTAL PERIOD (h) | TEMPERATURE RANGE (●FOR 15 TO 35°C, × FOR THE OTHER RANGE) | HUMIDITY RANGE (●FOR 20 TO 80%, × FOR THE OTHER RANGE) | PROPRIETY IN TERMS OF HUMIDITY PERIOD (●FOR 8 HOURS OR LESS OF BOTH FIRST AND SECOND PERIODS, × FOR 8 HOURS OR LONGER OF EITHER FIRST OR SECOND PERIOD) |
|---|---|---|---|---|---|---|---|
| MFP1 | 30 | 60 | 5.1 | 0 | ● | ● | ● |
| MFP2 | 10 | 30 | 0 | 1.2 | × | ● | ● |
| MFP3 | 30 | 85 | 10.2 | 0 | ● | × | × |
| MFP4 | 20 | 15 | 0 | 11.8 | ● | ● | × |

FIG. 21B

■CONTROL OVER EACH CASSETTE

| UNIT NAME | CASSTTE 1 | | CASSTTE 2 | | PROPRIETY OF CASSTTE 1 (●FOR 8 HOURS OR LESS OF BOT FIRST AND SECOND PERIODS, ×FOR 8 HOURS OR LONGER OF EITHER FIRST OR SECOND PERIOD) | PROPRIETY OF CASSTTE 2 (●FOR 8 HOURS OR LESS OF BOT FIRST AND SECOND PERIODS, ×FOR 8 HOURS OR LONGER OF EITHER FIRST OR SECOND PERIOD) |
|---|---|---|---|---|---|---|
| | FIRST TOTAL PERIOD (h) | SECOND TOTAL PERIOD (h) | FIRST TOTAL PERIOD (h) | SECOND TOTAL PERIOD (h) | | |
| MFP1 | 3.2 | 0 | 1 | 0 | ● | ● |
| MFP2 | 1.8 | 0.8 | 12.6 | 0 | ● | × |

PRINTING SYSTEM, IMAGE FORMING DEVICE, PRINTING CONTROL METHOD AND PRINTING CONTROL PROGRAM

CROSS-NOTING PARAGRAPH

This nonprovisional application claims priority under 35 U.S.C. §119(a) on Patent Applications No. 2005-220669 filed in Japan on Jul. 29, 2005, No. 2005-358949 filed in Japan on Dec. 13, 2005, and No. 2005-358966 filed in Japan on Dec. 13, 2005, the entire contents of which are hereby incorporated herein by reference.

FIELD OF THE INVENTION

The present invention relates to a printing system having a network connection, an image forming device, a printing control method, and a printing control program, and more particularly, to a printing system that makes a printing server grasp the state of each image forming device such as a printer, copier, fax machine, and multifunction printer, connected to the printing server via a network, and control each image forming device on the basis of its condition, and/or that makes the printing server assign a job volume for printing data to each image forming device on the basis of a judgment on the state of the image forming device for executing distributed printing, and as well as to an image forming device, a print control method, and a print control program for a computer to execute the print control method, used for the printing system.

BACKGROUND OF THE INVENTION

As the office automations are progressed these days, many image forming devices, such as printers, copiers, fax machines, and multifunction printers, have been installed in offices in a concentrated or distributed layout, where the image forming devices are usually connected to a server via a network. Locations vary in installing those image forming devices including printers, copiers, fax machines, and multifunction printers. Some locations may offer an unfavorable environment for the image forming devices to operate. Particularly, when a daylong environment or a year-round environment changes greatly, the image forming devices are exposed to a constant risk of bedewing.

At offices and schools, sometimes a large volume of printed matters have to be prepared within a certain period. In such a case, a distributed printing system is employed to carry out division printing by grouping a plurality of the image forming devices, instead of using only one image forming device.

Environmental conditions for locations where image forming devices are installed vary widely at large offices, schools, etc. Some locations are in high temperature and others are in low temperature, and some are in high humidity and others are in low humidity, and some locations have a large fluctuation in temperature and humidity. Quite a few locations are not preferable for installation, and some measures for preventing the devices from bedewing is required for the location where temperature and humidity changes fiercely. Particularly, an electrophotographic image forming device is equipped with photosensitive drums, charged rollers, transfer rollers, optical lenses, dustproof glasses, and the like, and bedewing those equipment results in the formation of a blur or blot on a formed image that deteriorates image quality substantially, or causes a device failure.

Such a phenomenon as bedewing happens when photosensitive rollers or the like cooled at night touches the fresh air heated by a heater or the like, especially tends to happen just after the start of the device in winter. Image forming devices, therefore, must be under constant monitoring in terms of installation environment, and a bedewed or possibly bedewed image forming device must be excluded from printing operation.

The electronic copier disclosed in Japanese Laid-Open Patent Publication No. 60-76759 offers a technique for preventing bedewing on an image forming device. This copier detects temperature and humidity inside and outside a copier body, and actuates a bedewing preventive heater inside the copier when external humidity reaches a value corresponding to a saturated steam pressure value at an internal temperature.

In another case, the image forming device disclosed in Japanese Laid-Open Patent Publication No. 11-38861 has an exhaust means that exhausts air in the device to the outside, a means that detects an external temperature, and a means that detects an internal temperature. This image forming device controls the output of the exhaust means in response to a difference between the internal temperature and the external temperature, which is detected by the temperature detecting means.

The installation environment monitoring device for a printing device disclosed in Japanese Laid-Open Patent Publication No. 2005-165036 offers a technique for monitoring an installation environment for an image forming device. The installation environment monitoring device comprises a detecting means that detects an environmental parameter indicating the environment of an installation location for the printing device, a judging means that judges on whether the environmental parameter is within the range of a prescribed environment permissible value or not, a message creating means that creates a message informing of a judgment that the environmental parameter is not within the range of the environment permissible value when the judging means makes that judgment, and a communication means that transmits the message created by the message creating means to an external apparatus.

According to the optimum distributed printing system disclosed in Japanese Laid-Open Patent Publication No. 11-194911, the report printing capacity of each printing device is estimated to allow a plurality of grouped printing devices to exert their full capacity as a whole and enable printing of multiple reports in a shortest time. In this system, a printing server calculates a time each printing device takes to output printing data on the basis of printing capacity data of each printing device that is a candidate for distributed job assignment. With the calculated output time, the printing server optimizes the distribution of printing data so that each printing device finishes individual printing job at the same time, and assigns distributed data to each printing device, then gives printing instruction.

According to the conventional image forming devices as described above, individual judging means attached to each image forming device judges a state for bedewing independently. The conventional image forming devices, therefore, offers no uniform judging method, thus makes judgments that cannot be considered to be reliable enough. Such image forming devices are not appropriate to be interconnected via a network to construct a printing system.

A conventional image forming device provided with a bedewing preventive device is so constructed as to actuate the bedewing preventive device in advance when there is a concern of bedewing in the device. SO, it is not preferable from the point of energy saving for the case that a lot of image forming devices are connected in network because the power consumption for preventing bedewing becomes larger.

When a large volume of printed matters are prepared quickly by distributed printing, image forming devices have to be used as many as possible. If image forming devices not satisfying a given operational environmental condition, such as ones in a bedewing state, are not used but only the image forming devices satisfying the given operational environmental condition are used, the number of image forming devices to be used decreases and that makes it impossible to meet a requirement for printing in a shortest time.

When the individual judging means attached to interconnected each image forming device independently judges whether or not bedewing is developing in the device or whether or not the installation location environment of the device satisfies a given environmental condition, the judgment becomes less reliable because the criteria for the judgment is not uniform. Such image forming devices, therefore, are not appropriate to be interconnected via a network to construct a printing system.

SUMMARY OF THE INVENTION

An object of the present invention is to provide a printing system for such a distributed printing system that includes a plurality of image forming devices, such as printers, copiers, fax machines, and multifunction printers, connected via a network, judges the environmental state of each image forming device, such as a bedewing state, with a uniform criteria and method in a highly reliable manner, executes printing operation in response to a distributed printing request without using an image forming device not in a given environmental state, such as in a bedewed condition and/or without staying in a stand-by state for printing for a long time, and is capable of highly efficient distributed printing, and to provide a printing control method, and a program for a computer to execute the printing system.

An image forming device not in a given operational environment state can be operated under control for reducing load on the device when the operational environment of the device is not out of the given operational environment to a great extent. Accordingly, another object of the present invention is to operate an image forming device not in a given operational environment by reducing load on the device and to enable the use of image forming devices in a broader operational environment.

Not using image forming devices not in a preset given operational environment limits a number of usable image forming devices, thus hampers office work using the image forming devices. Accordingly, a further object of the present invention is to actuate only the bedewing preventive mechanisms of image forming devices in an environmental condition for bedewing among image forming devices interconnected via a network so as to limit the number of the image forming devices with the bedewing preventive mechanisms on operation, thus prevent bedewing with less power consumption and turn inoperable image forming devices to operable ones.

The state of each image forming device is judged based on the current temperature and humidity in an operational environment of the device. Preferably, however, such judgment should be made in consideration of the history of temperature and humidity as well as of the current temperature and humidity. Accordingly, still another object of the present invention is to judge the state of each image forming device precisely in consideration of the history of operational environment of the device and control the image forming device based on the results of the judgment.

A first technical means of the present invention is a printing system comprising a printing server; and a plurality of image forming devices connected to the printing server, wherein each image forming device has an operational environment information acquiring means that acquires operational environment information of each image forming device, and an operational environment information sending means that sends the acquired operational environment information to the printing server, wherein the printing server has a control means that judges a state of each image forming device on the basis of the operational environment information sent to the printing server, and that controls each image forming device on the basis of the results of the judgment.

A second technical means is the printing system of the first technical means, wherein the control means of the printing server judges whether or not each image forming device is in a given operational environment on the basis of the operational environment information, and sends printing data to an image forming device that is in the given operational environment.

A third technical means is the printing system of the second technical means, wherein the operational environment information consists of temperature information and humidity information, and wherein the given operational environment is an environment where each image forming device is not bedewed.

A fourth technical means is the printing system of the first technical means, wherein each image forming device has an operational state information sending means that sends operational state information to the printing server, and wherein the control means of the printing server controls each image forming device on the basis of the operational state information sent to the printing server.

A fifth technical means is the printing system of the first technical means, wherein each image forming device has a means that acquires temperature environment information of an installation location of each image forming device, and that sends the acquired temperature environment information to the printing server, and wherein the printing server analyzes the temperature environment information sent to the printing server, selects an image forming device best to image formation on the basis of the results of the analysis, and sends printing data to the selected image forming device.

A sixth technical means is the printing system of the first technical means, wherein each image forming device has a means that acquires humidity environment information of an installation location of each image forming device, and that sends the acquired humidity environment information to the printing server, and wherein the printing server analyzes the humidity environment information of the installation location of each image forming device, selects an image forming device best to image formation on the basis of the results of the analysis, and sends printing data to the selected image forming device.

A seventh technical means is the printing system of the first technical means, wherein the image forming devices are classified into groups, and wherein when the control means of the printing server cannot acquire environmental information from one image forming device in a group, the control means acquires environmental information from another image forming device in the same group and judges a state of the another image forming device.

An eighth technical means is the printing system of the first technical means, wherein when the control means of the printing server judges that an image forming device is not in the given operational environment, the control means changes control over the image forming device to reduce load thereon, and then sends printing data to the image forming device.

A ninth technical means is the printing system of the eighth technical means, wherein printing data of total pages not more than a given amount is sent to an image forming device having an internal temperature that is not within the given operational environment.

A tenth technical means is the printing system of the ninth technical means, wherein the given amount is changed according to a type of recording papers used for printing.

An eleventh technical means is the printing system of the eighth technical means, wherein printing data of only one page is sent to an image forming device having internal humidity that is not within the given operational environment during a time when a recording paper is fed and is ejected out.

A twelfth technical means is the printing system of the first technical means, wherein each image forming device has a means for changing its operational environment, wherein when the control means of the printing server judges that an image forming device is not in the given operational environment, the control means actuates the means for changing operational environment, and sends printing data to the image forming device after an operational environment for the image forming device has been turned into the given operational environment.

A thirteenth technical means is the printing system of the twelfth technical means, wherein the means for changing operational environment is a bedewing preventive means, and wherein when the control means of the printing server judges that an image forming device is in a bedewing state, the control means sends a bedewing clearing signal for actuating the bedewing preventive means to the image forming device.

A fourteenth technical means is the printing system of the thirteenth technical means, wherein the control means of the printing server judges that the image forming device is an image forming device to which printing data can be sent when a given time has passed since the control means sent the bedewing clearing signal to the image forming device.

A fifteenth technical means is the printing system of the first technical means, wherein the control means of the printing server judges whether or not each image forming device is in the given operational environment in consideration of a history of an operational environment for each image forming device.

A sixteenth technical means is the printing system of the fifteenth technical means, wherein the history of the operational environment represents a total of time when the humidity is out of a given range during a given period, and wherein when the total of time exceeds a given time, the image forming device is judged to be not in the given operational environment.

A seventeenth technical means is an image forming device used in the printing system of any one of the first to sixteenth technical means.

An eighteenth technical means is a printing control method for the printing system of any one of the first to sixteenth technical means, wherein each of the image forming devices acquires its own operational environment information respectively, and sends the acquired operational environment information to the printing server, and wherein the printing server judges a state of each image forming device on the basis of the operational environment information, and controls each image forming device on the basis of the results of the judgment.

A nineteenth technical means is a printing control program for a computer to execute the printing control method of the eighteenth technical means.

A twentieth technical means is a distributed printing system comprising a plurality of image forming devices; and a printing server that sends printing data to the image forming devices to execute distributed printing, wherein each image forming device has an operational environment information acquiring means that acquires operational environment information of each image forming device, and an operational environment information sending means that sends the acquired operational environment information to the printing server, and wherein the printing server has a control means that judges a state of each image forming device on the basis of the operational environment information, and that decides an assignment of an amount of distributed print job to be sent to each image forming device on the basis of the results of the judgment.

A twenty-first technical means is the distributed printing system of the twentieth technical means, wherein the control means judges whether or not each of the image forming devices is in a bedewing state on the basis of the operational environment information, instructs image forming devices in the bedewing state to clear bedewing, estimates the times that the image forming devices in the bedewing state take to clear bedewing and also estimates the respective time when each of the image forming devices in the bedewing state will finish respective print jobs after it clears its bedewing state, and then assigns an amount of distributed print job to each image forming device so that each image forming device finishes the assigned print job at the same time.

A twenty-second technical means is the distributed printing system of the twentieth technical means, wherein the operational environment information acquiring means acquires a temperature of an installation environment of each image forming device, and wherein the control means reduces an amount of printing data sent as an assigned job to an image forming device that is in an installation environment where the temperature is lower than a given value.

A twenty-third technical means is the distributed printing system of the twentieth technical means, wherein the operational environment information acquiring means acquires a humidity of an installation environment of each image forming device, and wherein the control means controls an image forming device that is in an installation environment where the humidity is out of a given range to carry out the printing work for a recording medium one by one.

A twenty-fourth technical means is a printing control method for the distributed printing system of the twentieth technical means, wherein each image forming device acquires operational environment information of each image forming device, and sends the acquired operational environment information to the printing server, and wherein the printing server judges a state of each image forming device on the basis of the operational environment information, and decides an assignment of an amount of distributed print job to be sent to each image forming device on the basis of the results of the judgment.

A twenty-fifth technical means is a printing control program for a computer to execute the printing control method of the twenty-fourth technical means for the printing system, wherein the control program has the step for each image forming device to acquire the operational environment information of each image forming device; the step for each image forming device to send the acquired operational environment information to the printing server; the step for the printing server to judge a state of each image forming device on the basis of the operational environment information; and the step for the printing server to decide an assignment of an amount of distributed print job to be sent to each image forming device on the basis of the results of the judgment.

BRIEF DESCRIPTION OF THE DRAWINGS

FIGS. 9A, 9B are graphic diagrams showing respective control tables stored in the printing server;

FIGS. 21A, 21B are graphic diagrams showing respective control tables on the printing server;

PREFERRED EMBODIMENTS OF THE INVENTION

The following is a description of embodiments of the present invention in reference to FIGS. 1 to 35.

Figure 1:
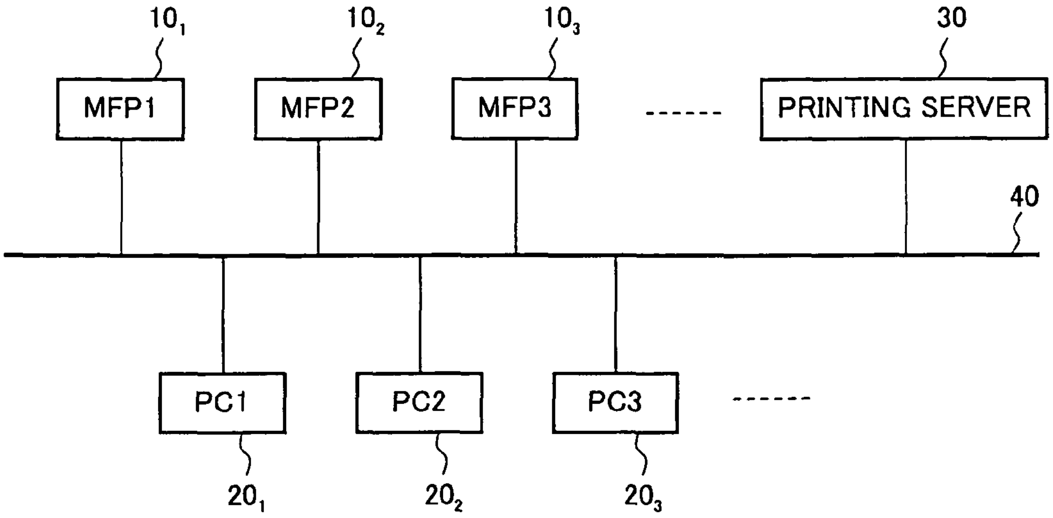
FIG. 1 is a schematic block diagram showing a printing system according to an embodiment of the present invention.

FIG. 1 is a schematic block diagram showing a printing system according to an embodiment of the present invention. Multifunction printers (MFP) $\mathbf{10}_1$, $\mathbf{10}_2$, $\mathbf{10}_3$, - - - and personal computers (PC) $\mathbf{20}_1$, $\mathbf{20}_2$, $\mathbf{20}_3$, - - - are connected to a printing server 30 via a network 40 such as LAN. Each multifunction printer (MFP) $\mathbf{10}_1$, $\mathbf{10}_2$, $\mathbf{10}_3$, - - - is a network printer, and can be used in common by a plurality of users via the personal computers (PC) $\mathbf{20}_1$, $\mathbf{20}_2$, $\mathbf{20}_3$, - - - . This printing system employs the multifunction printers as image forming devices, but this is not the only case. In addition to multifunction printers, single-purpose machines, such as copiers, printers, and fax machines, are also applicable to the system as image forming devices, and a desired number of desired multifunction printers and single-purpose machines can be selected and connected to the printing server.

The multifunction printers (MFP) $10_1$, $10_2$, $10_3$, - - - , as shown in FIG. 1, are installed in a spacious office or the like, where the location of each printer is under different environments of high or low temperatures, high or low humidity, or fluctuating temperature and humidity. This makes a user difficult to grasp the bedewing state of each multifunction printer and decide which multifunction printer to operate for printing work or which multifunction printers to be grouped for carrying out distributed printing.

Figure 2:
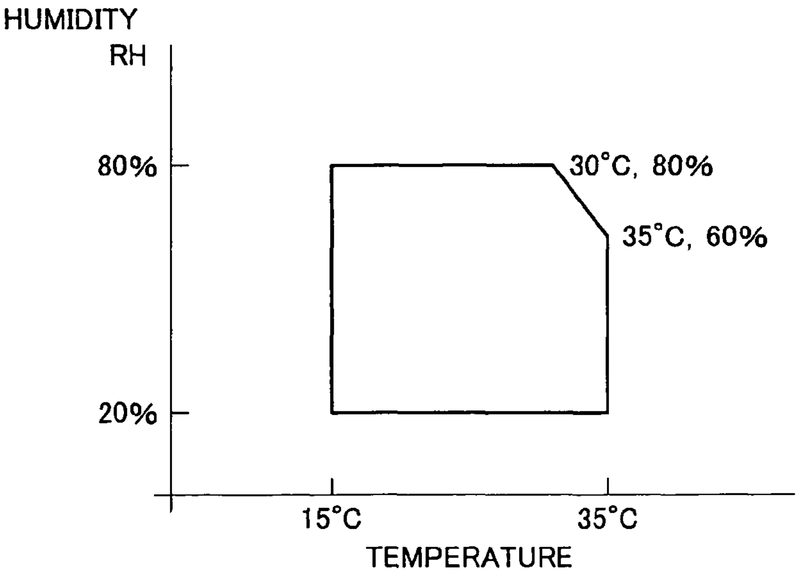
FIG. 2 is a graphic diagram showing an operational environment condition for a common image forming device.

FIG. 2 is a graphic diagram showing an operational environment condition for a common image forming device. An image forming device in common use today is guaranteed to operate as described in the specification when the operational environmental condition of the device is within the range shown in FIG. 2. The common image forming device manages to work even if in an operational environmental condition that is out of the range shown in FIG. 2. In a state of bedewing or an abnormally dry condition, however, the image forming device is not certain to operate according to the specification, showing deteriorated print quality and being apt to cause operational failures, such as jamming.

Figure 3A:
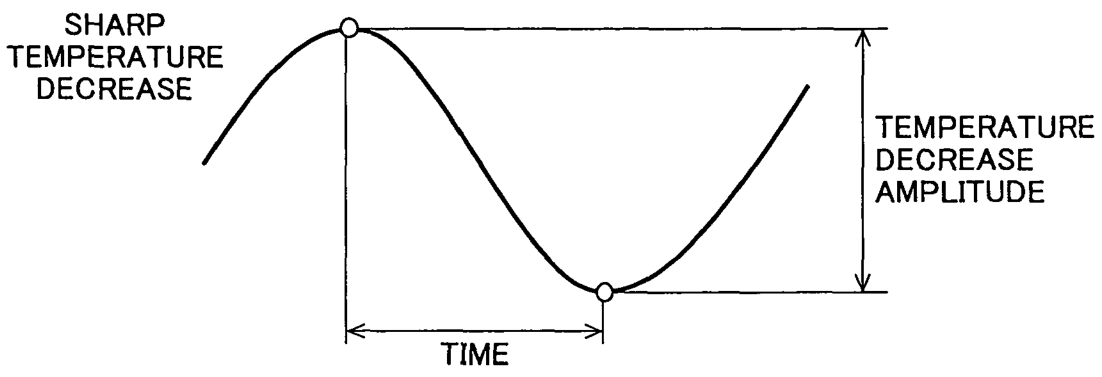
FIGS. 3A, 3B are graphs showing instances of temperature changes leading to bedewing.
Figure 3B:
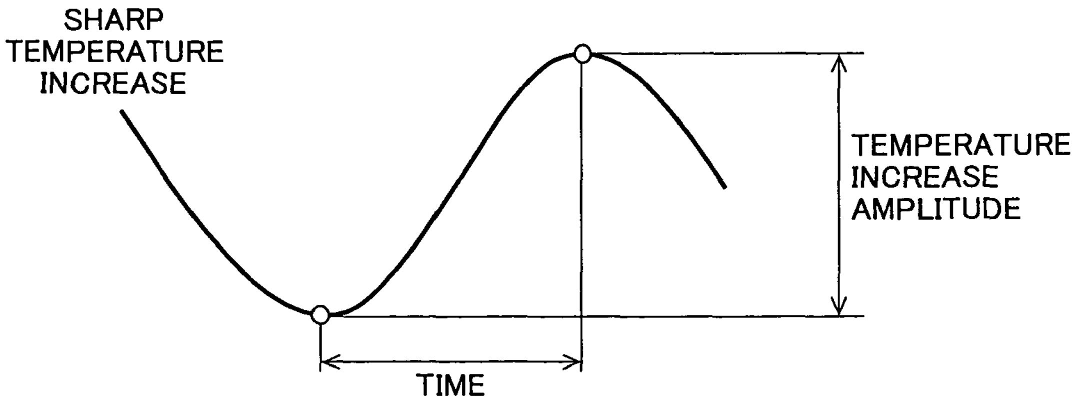

FIGS. 3A, 3B are graphs showing instances of temperature changes leading to bedewing. FIG. 3A indicates an instance of a sharp temperature decrease, while FIG. 3B indicates an instance of a sharp temperature increase.

When the operational environment of an image forming device changes with sharply decreasing or increasing temperature, dew condenses in a writing laser optical system or on papers in a paper feeding cassette to cause such problems that the amount of laser light emitted on a photosensitive body reduces to produce an image of lower concentration or even no image at all, or that the papers absorb moisture to cause frequent paper jams.

According to the present invention, the development of bedewing is concluded when a change in the environment of the installation locations of the image forming devices satisfies any of the following conditions.

(A) when the temperature decreases from a state of high temperature and humidity, (B) when the temperature and humidity increase from a state of low temperature.

The experimental results have verified the fact that the following conditions lead to bedewing.

(a) A device has been left in an environment showing a temperature of 20 C.° and (relative) humidity of 50% for 120 minutes, and bedewing has resulted in the device as the temperature increases to 30 C.° and the humidity to 80%.

The reason for bedewing: The device having a temperature of 20 C.° has touched the fresh air 1 of 30 C.° in temperature and 80% in humidity, which has caused the fresh air 1 to exceed its saturated steam point on the surface of the device.

(b) A device has been left in an environment showing a temperature of 30 C.° and (relative) humidity of 80% for 120 minutes, and bedewing has resulted in the device as the temperature decreases to 20 C.° and the humidity to 50%.

The reason for dew condensation: The fresh air 2 having a temperature of 20 C.° has touched the fresh air 1 of 30 C.° in temperature and 80% in humidity, which has caused the fresh air 1 to exceed its saturated steam point.

(c) A device has been left in an environment showing a temperature of 5 C. ° and (relative) humidity of 20% for 120 minutes, and bedewing has resulted in the device as the temperature increases to 25 C.° and the humidity to 50%.

The device having a temperature of 5 C.° has touched the fresh air 1 of 25 C.° in temperature and 50% in humidity, which has caused the fresh air 1 to exceed its saturated steam point on the surface of the device.

Figure 4:
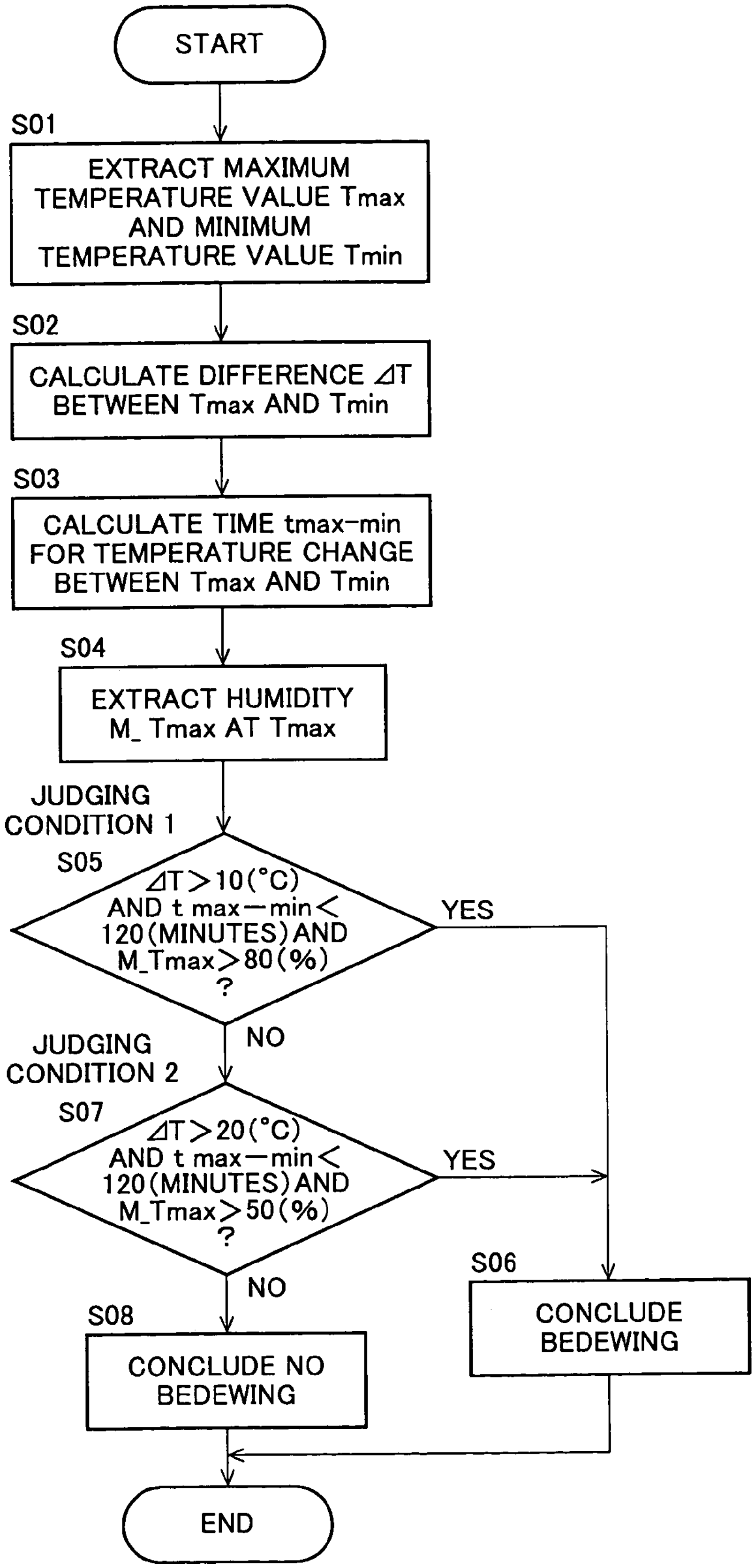
FIG. 4 is a flowchart depicting a process of judging whether or not bedewing is developing in an image forming device.

FIG. 4 is a flowchart depicting a process of judging whether or not bedewing is developing in an image forming device.

A maximum temperature value Tmax and a minimum temperature value Tmin are extracted (step 01), a difference ΔT between the maximum value Tmax and the minimum value Tmin is calculated (step 02), the time tmax-min for a temperature change between the maximum value Tmax and the minimum value Tmin is calculated (step 03), and humidity M_Tmax at the maximum value Tmax is extracted (step 04).

Subsequently, based on the confirmed bedewing conditions (a) (b), the satisfaction of a first judging condition is examined, which is to check to see if a temperature change exceeds 10 C.°, the time for the temperature change is within 120 minutes, and humidity at high temperature exceeds 80%, that is, check to see if the following three inequalities are satisfied simultaneously: ΔT>10 C.°; tmax-min<120 minutes; M_Tmax>80% (step 05). If the first judging condition is satisfied (YES at step 05), bedewing is concluded (step 06).

If the three inequalities, i.e., the first judging condition, are not satisfied at step 5 (NO at step 5), judgment on a bedewing state is then made based on a second condition. The second judging condition, based on the confirmed bedewing condition (c), is to check to see if the following three inequalities are satisfied simultaneously: ΔT>20 C.°; tmax-min<120 minutes; M_Tmax>50% (step 7). If the second judging condition is satisfied (YES at step 07), bedewing is concluded (step 06). If the second judging condition is not satisfied (NO at step 07), no bedewing is concluded (step 08).

The following methods are effective in clearing dew condensation on an image forming device. One is to actuate dehumidifiers, such as an insulation heater, blast fan, etc., built in the device body, for example, for 10 minutes. Another is to leave the image forming device in an environmental condition other than a bedewing condition, for example, for 45 minutes.

Figure 5:
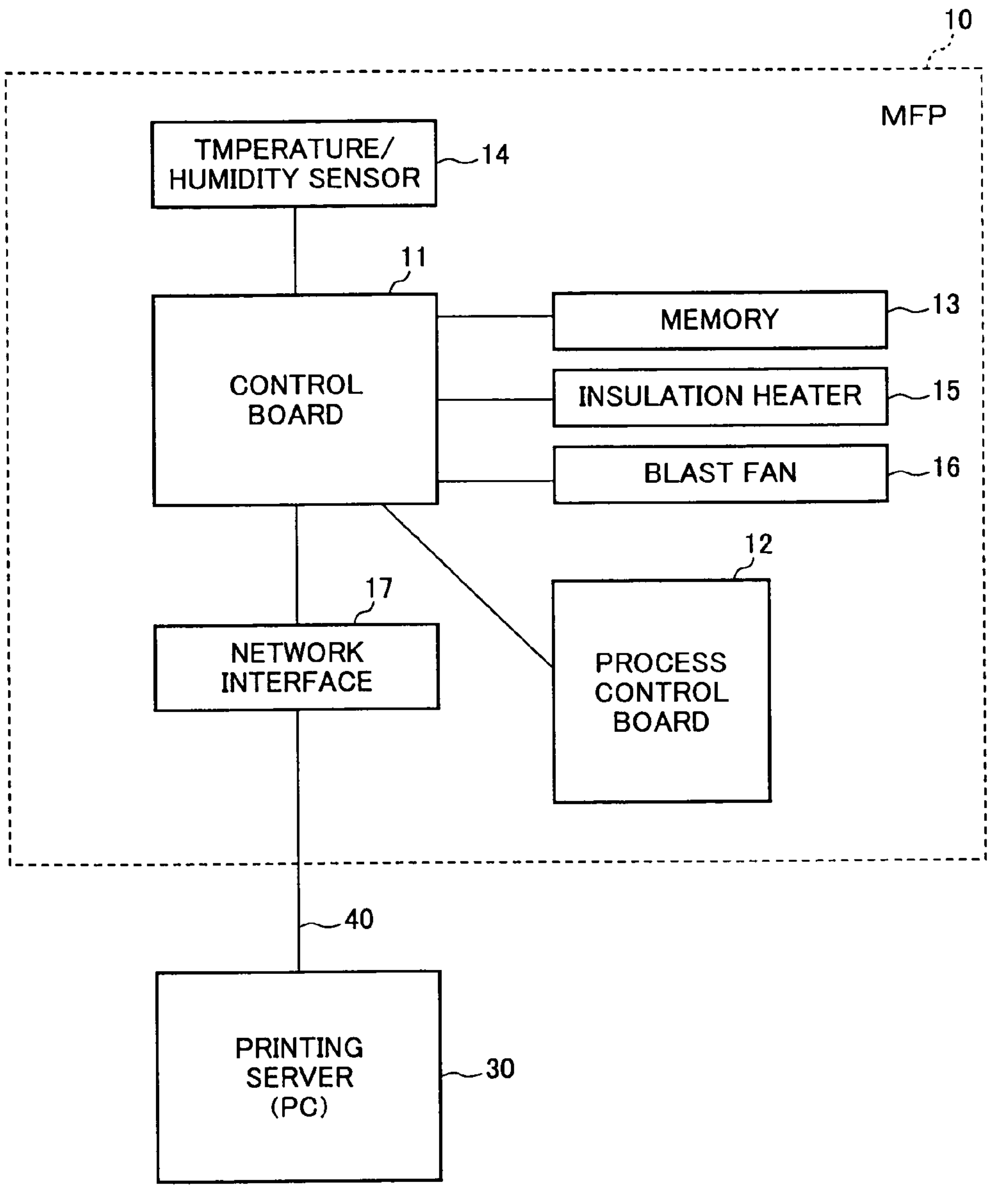
FIG. 5 is a schematic block diagram showing the relation between a multifunction printer and a printing server.

FIG. 5 is a schematic block diagram showing the relation between a multifunction printer and a printing server according to the first embodiment.

Each multifunction printer 10 composing the printing system according to the embodiment of the present invention includes a control board (PWB: Printed Wiring Board) 11 carrying a CPU or the like, a process control board 12, a memory 13, a temperature/humidity sensor 14, an insulation heater 15, a blast fan 16, and a network interface 17. The multifunction printer 10 is connected to the printing server 30 via the network 40 such as LAN.

Usually, a thermistor is employed as the temperature sensor and a several types of ceramic sensors are employed as the humidity sensor for the multifunction printer 10. The temperature/humidity sensors 14 is disposed preferably near a photosensitive drum or a developer in the printer body, but is usually arranged in a place where the average temperature and humidity can be measured. In most cases, the temperature/humidity sensor 14 is mounted on the control board 11 in the printer body. The insulation heater 15 is disposed near an optical lens or on a paper feeding cassette.

First Embodiment

The printing system according to the first embodiment works as described below to achieve the above objects of the invention.

The printing server 30 judges the bedewing state of each multifunction printer $10_1$, $10_2$, $10_3$, - - - on the basis of a measurement given by the temperature/humidity sensors 14 incorporated into each multifunction printer, and sends printing data to a multifunction printer 10 without bedewing to make the printer 10 print out.

Figure 6:
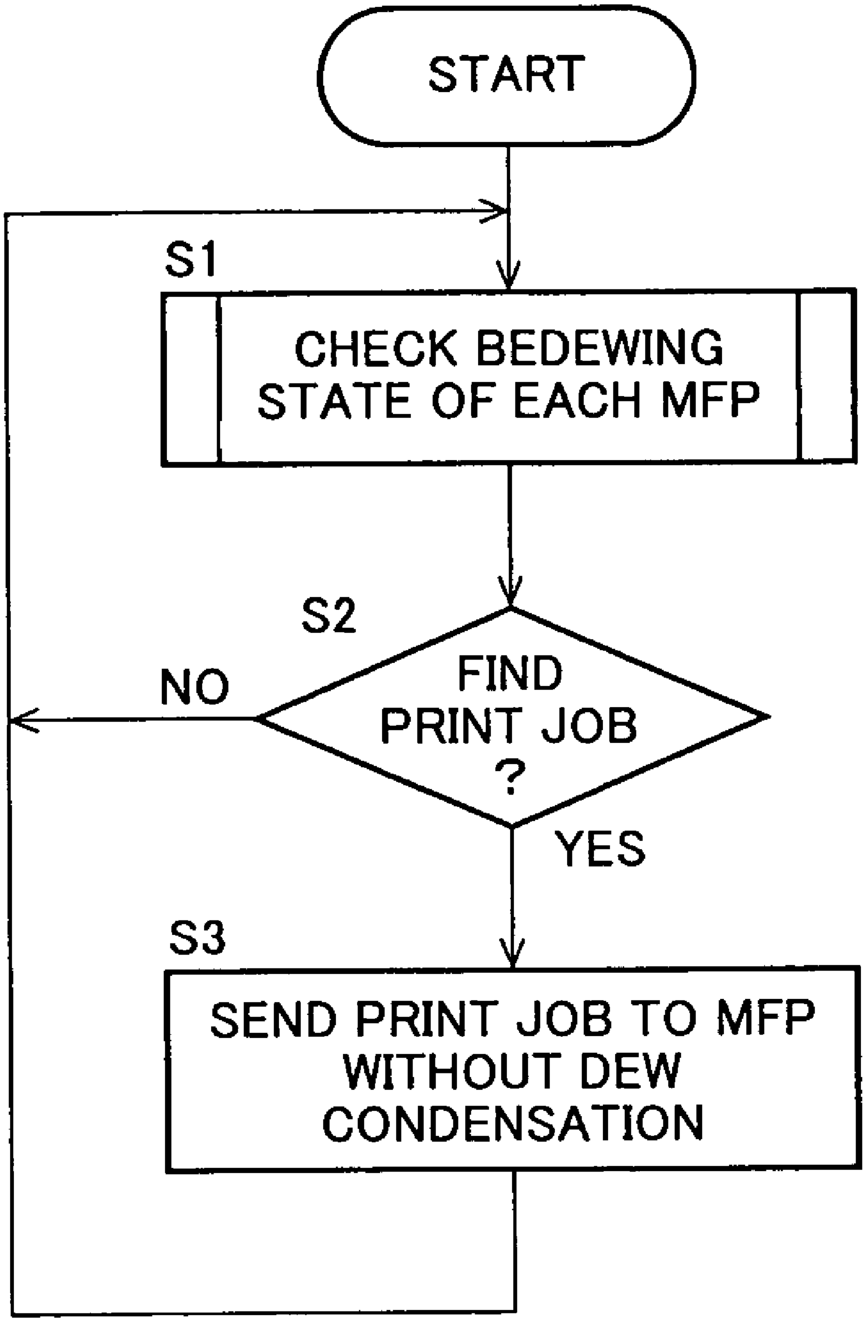
FIG. 6 is a flowchart depicting a process that the printing server sends printing data to a multifunction printer after considering the bedewing state of each multifunction printer in a printing system according to a first embodiment.

FIG. 6 is a flowchart depicting a process that the printing server sends printing data to a multifunction printer after considering the bedewing state of each multifunction printer in the printing system according to the first embodiment.

The printing server 30 checks each multifunction printer $\mathbf{10}_1$, $\mathbf{10}_2$, $\mathbf{10}_3$, - - - for a bedewing state one after another to grasp the bedewing state of each multifunction printer (step 1). The printing server 30 checks a print job from a personal computer 20 or the like connected to the printing server 30 via the network 40 (step 2). When the print job is sent to the printing server 30 (YES at step 2), the printing server 30 sends the print job to a multifunction printer 10 without bedewing, referring to the bedewing state of each multifunction printer that has been grasped at step 1 (step 3). When there is no print job at step 2 (NO at step 2), the printing server 30 returns to step 1 to check the bedewing state of each multifunction printer.

Figure 7:
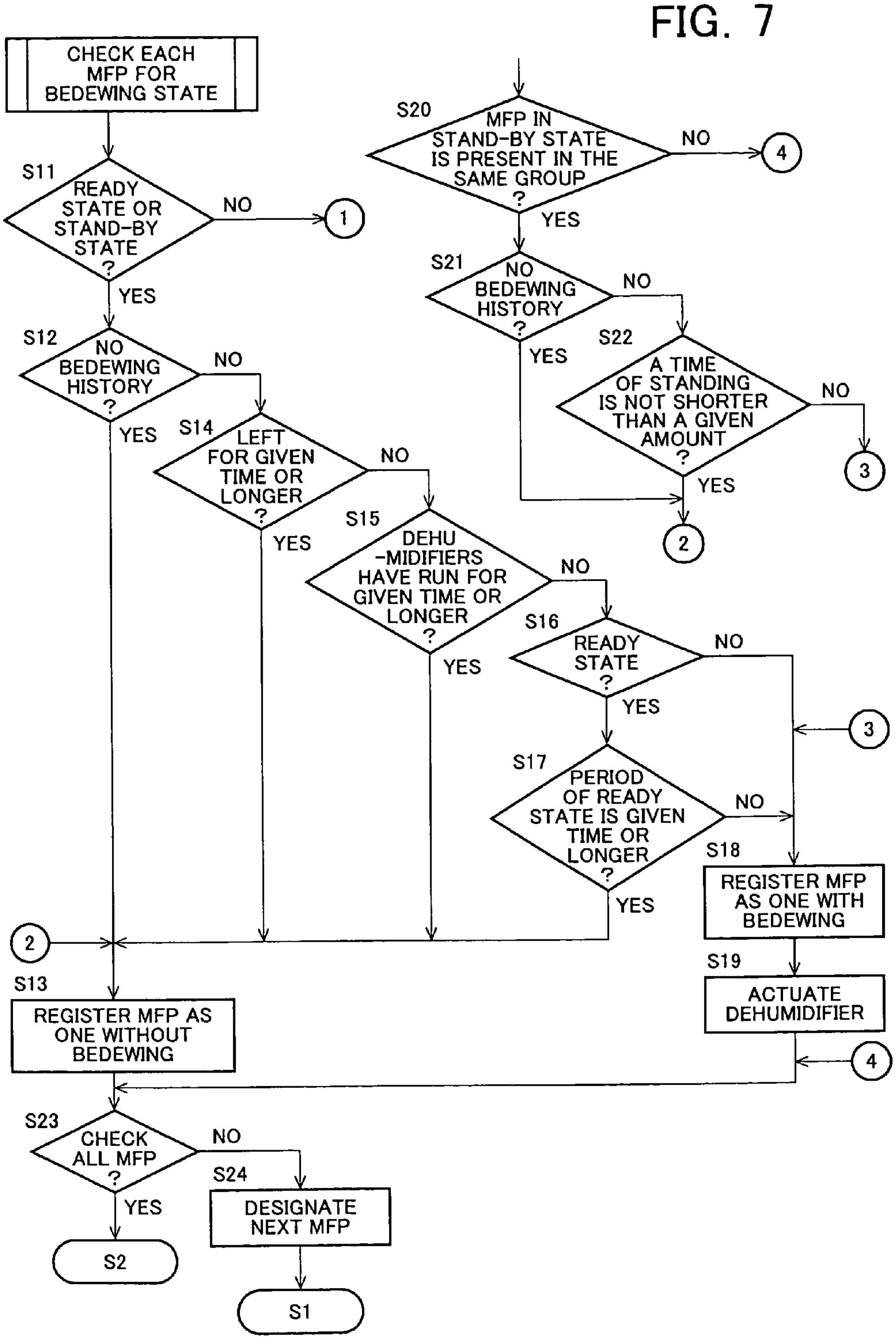
FIG. 7 is a flowchart showing the details of steps for grasping the bedewing state of each multifunction printer.

FIG. 7 is a flowchart showing the details of steps for grasping the bedewing state of each multifunction printer.

In the process at step 1 for grasping the bedewing state of each multifunction printer 10, the printing server 30 checks to see if a multifunction printer 10 is in a ready state or in a stand-by state, or is cut off from the power supply to be incapable of replying to the printing server 30 (not in the ready state) (step 11).

The ready state means that the multifunction printer 10 is ready to start immediately as it is kept at a constant temperature with a heater of a fixing device being energized. The stand-by state means that the multifunction printer 10 is in an energy saving mode as it is supplied with power but is under no temperature control with the heater being not energized.

At step 11, if the multifunction printer 10 is in the ready state or in the stand-by state (YES at step 11), the printing server 30 refers to bedewing histories on control tables shown in FIGS. 9A, 9B, which will be described later, and checks to see if the multifunction printer 10 has a history of being in the bedewing state (step 12). Finding no history of bedewing state (YES at step 12), the printing server 30 registers the multifunction printer 10 as one not in the bedewing state (step 13), and proceeds to a process of grasping the bedewing state of other multifunction printers.

If a history of bedewing state is found at step 12 (NO at step 12), the printing server 30 checks to see if the multifunction printer 10 has been left for a given time, for example, 45 minutes or longer (step 14). If the multifunction printer 10 has been left for the given time or longer (YES at step 14), the printing server 30 considers the multifunction printer 10 to be not in the bedewing state and enters "No" in bedewing state columns and in bedewing history columns as well in the control table shown in FIGS. 9A, 9B (step 13).

At step 14, if the multifunction printer 10 has not been left for the given time or longer (NO at step 14), the printing server 30 checks to see if the dehumidifiers, such as the insulation heater 15 and the blast fan 16, have run for a given time, for example, 10 minutes or longer (step 15). If the dehumidifiers are found to have run for the given time or longer (YES at step 15), the printing server 30 considers the multifunction printer 10 to be not in the bedewing state and enters "No" in the bedewing state columns and in the bedewing history columns as well in the control table shown in FIGS. 9A, 9B (step 13).

At step 15, when the dehumidifiers are found to have not run for the given time or longer (NO at step 15), the printing server 30 checks to see if the multifunction printer 10 is in the ready state (step 16), and, when finding multifunction printer 10 to be in the ready state (YES at step 16), checks to see if the period of the ready state is a given time or longer (step 17). If the period of the ready state is the given time or longer (YES at step 17), the printing server 30 considers the multifunction printer 10 to be not in the bedewing state and enters "No" in the bedewing state columns and in the bedewing history columns as well in the control table shown in FIGS. 9A, 9B (step 13).

At step 16, when the multifunction printer 10 is found to be not in the ready state (NO at step 16), the printing server 30 registers the multifunction printer 10 as one with bedewing in progress (step 18), and starts the dehumidifiers (step 19), then ends a cycle of steps to proceed to a process of grasping the bedewing state of other multifunction printers.

When finding the period of the ready state to be not the given time or longer at step 17 (No at step 17), the printing server 30 registers the multifunction printer 10 as one with bedewing in progress (step 18).

At step 11, if the multifunction printer 10 does not respond to the printing server 30 because of no power supply or other reasons, the printing server 30 picks out another multifunction printer 10 in the stand-by or ready state out of multifunction printers 10 belonging to the same group as the non-responding multifunction printer 10 does (YES at step 20). If the picked multifunction printer 10 has no bedewing history (YES at step 21), it is registered as a multifunction printer 10 not in the bedewing state (step 13).

Even if the picked multifunction printer 10 is found to have a bedewing history at step 21 (No at step 21), when the picked multifunction printer 10 has been left for the given time of, for example, 45 minutes, or longer (YES at step 22), the picked multifunction printer 10 is registered as a multifunction printer 10 not in the bedewing state (step 13).

At step 22, when the picked multifunction printer 10 has been left for less than the given time (No at step 22), the picked multifunction printer 10 is registered as a multifunction printer 10 with bedewing in progress (step 18), and the dehumidifiers are started (step 19).

At step 20, when the printing server 30 cannot find another substituting multifunction printer 10 in the same group to which non-responding multifunction printer 10 belongs, or only finds a multifunction printer 10 not in the stand-by or ready state (No at step 20), the printing server 30 ends a cycle of steps to proceed to a process of grasping the bedewing state of other multifunction printers.

As described above, when one multifunction printer $\mathbf{10}_1$ has been checked through for the bedewing state, the next multifunction printer $\mathbf{10}_2$ is checked for the bedewing state. In this way, the printer server 30 checks every multifunction printer $\mathbf{10}_1$, $\mathbf{10}_2$, $\mathbf{10}_3$, - - - connected to the printing system for the bedewing state, and writes information on the bedewing state, together with other information, into the control tables on the printing server 30, which will be mentioned later.

Figure 8:
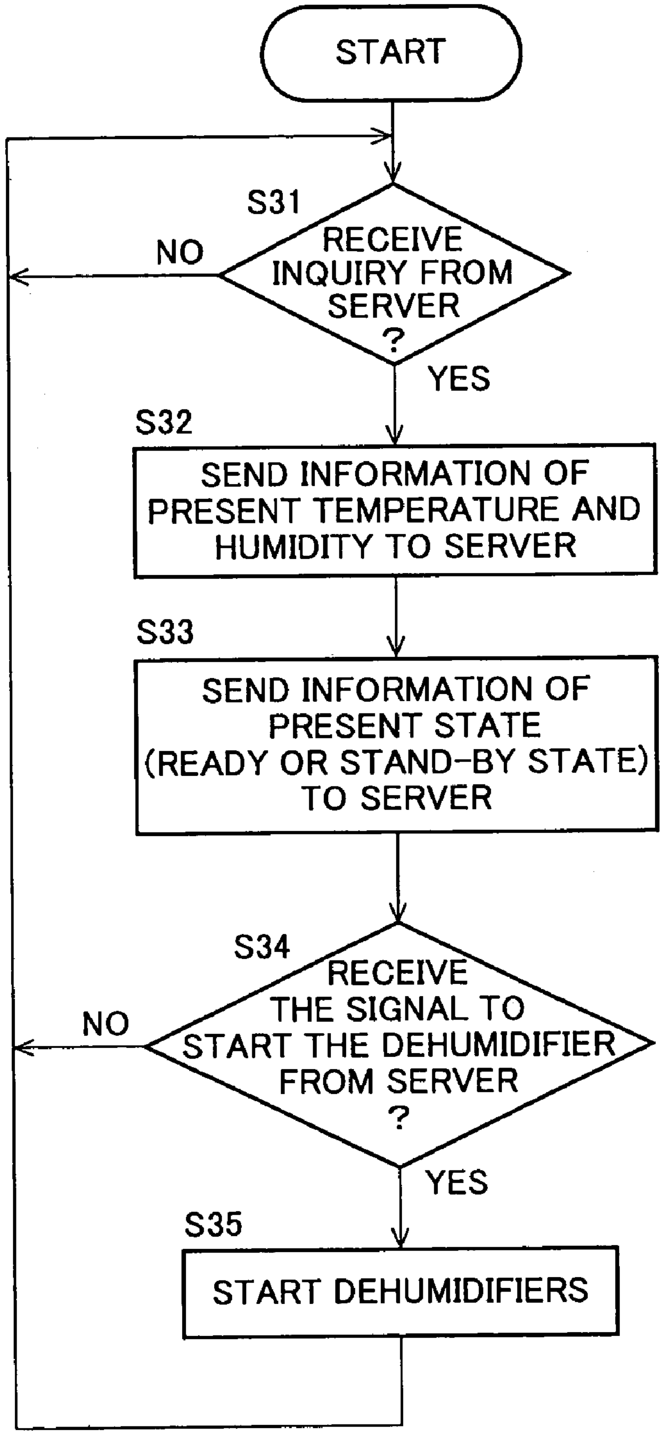
FIG. 8 is a flowchart depicting a process executed by a multifunction printer in response to an inquiry from the printing server.

FIG. 8 is a flowchart depicting a process executed by a multifunction printer in response to an inquiry from the printing server.

A multifunction printer 10 checks an inquiry from the printing server 30 (step 31), and, upon receiving an inquiry (YES at step 31), reads output from the temperature/humidity sensors 14 provided in the printer body, then sends information on the present temperature and humidity including related other information to the printing server 30 via the network 40 such as LAN (step 32). The multifunction printer 10 also sends information of its state of ready or stand-by to the printing server 30 (step 33). The multifunction printer 10 then checks to see if it has received a dehumidifier start signal from the printer server 30 (step 34). Finding a dehumidifier start signal received, the multifunction printer 10 actuates the dehumidifiers (step 35) and returns to step 31. Finding a dehumidifier start signal not received, the multifunction printer 10 returns directly to step 31.

The above process is executed by each multifunction printer $\mathbf{10}_1$, $\mathbf{10}_2$, $\mathbf{10}_3$, - - - . Meanwhile, based on the temperature/humidity information acquired from each multifunction printer, the printer server 30 judges whether or not bedewing is developing for each multifunction printer through the judgment flow described above, and writes the information on the bedewing state, together with other control information, into the control tables shown in FIGS. 9A, 9B.

FIGS. 9A, 9B are graphic diagrams showing respective control tables stored in the printing server. FIG. 9A exhibits the control table for recording control information on each multifunction printer, and FIG. 9B exhibits the control table for recording control information on multifunction printers classified into group categories.

The control table shown in FIG. 9A represents a case where image forming devices consisting of multifunction printers (MFP 1 to 8) are connected to the network. The items to be filled for each multifunction printer includes “power supply”, “bedewing history”, “time passage from start of ready”, “time passage in state of left alone”, “dehumidifiers have or have not started”, “dehumidifiers operating time”, and “bedewing”. An alteration in any item leads to an entry of updated data in the item. As shown in the control tables in FIGS. 9A, 9B, “YES” is written in the item of “bedewing history” while “No” is written in the item of “bedewing state” for some multifunction printers. This is because that the control tables shown in FIGS. 9A, 9B represent the state of those multifunction printers at a point before their bedewing histories are rewritten.

The control table shown in FIG. 9B represents a case where the image forming devices consisting of the multifunction printers (MFP 1 to 8) are classified into groups. The multifunction printers MFP 2, 3 form one group, while the multifunction printers MFP 4, 5 form another group. The items to be filled for each multifunction printer includes “group”, “power supply”, “bedewing history”, “time passage in state of left alone”, “dehumidifiers have or have not started”, and “bedewing”. An alteration in any item leads to an entry of updated data in the item.

When the multifunction printers are classified into groups, as indicated in the control table in FIG. 9B, and the printing server happens to find out upon sending printing data that the multifunction printer MFP 3 is out of service because of no power supply, the printing server refers to the control table shown in FIG. 9B, and extracts the multifunction printer MFP 2 which belongs to the same group 2 as the multifunction printer MFP 3 and is in the stand-by state and its dehumidifiers is not in operation.

Second Embodiment

Figure 10:
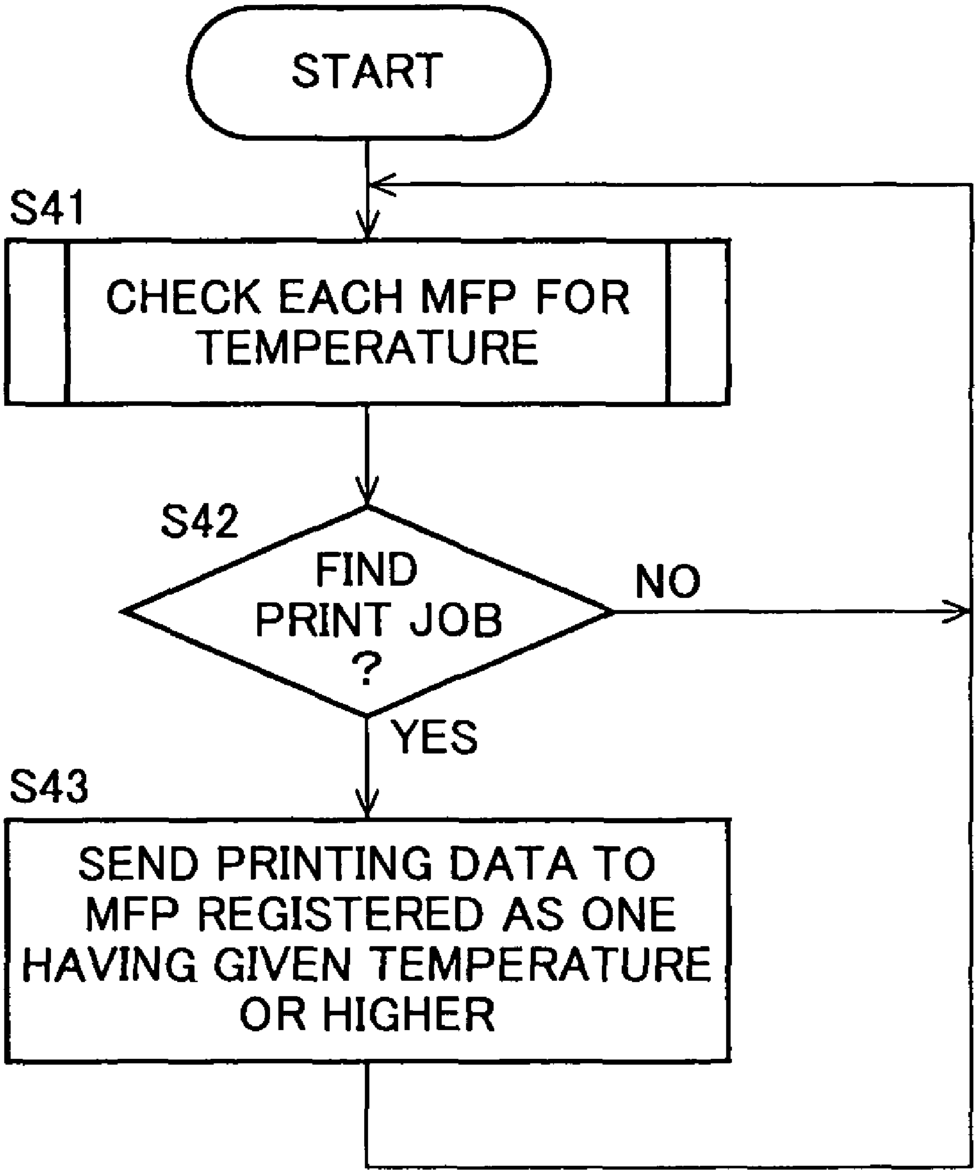
FIG. 10 is a flowchart depicting a process that the printing server checks the temperature state of each multifunction printer, and registers the said multifunction printer and sends printing data to the registered multifunction printer in the printing system according to a second embodiment.

FIG. 10 is a flowchart depicting a process that the printing server checks the temperature state of each multifunction printer, and registers the said multifunction printer, and sends printing data to the registered multifunction printer in the printing system according to a second embodiment.

In the printing system according to the second embodiment, the printing server 30 checks each multifunction printer $\mathbf{10}_1$, $\mathbf{10}_2$, $\mathbf{10}_3$, - - - for the environmental state one after another to check the temperature of each multifunction printer (step 41). The printing server 30 checks a print job from the personal computer 20 or the like connected to the printing server 30 via the network 40 (step 42). When the print job is sent to the printing server 30 (YES at step 42), the printing server 30 sends the print job to a multifunction printer registered as one that satisfies the given environmental condition as shown in FIG. 2, according to the temperature state of each multifunction printer that has been grasped at step 41 (step 43). When there is no print job at step 42 (NO at step 42), the printing server 30 returns to step 41 to check the temperature state of each multifunction printer.

Figure 11:
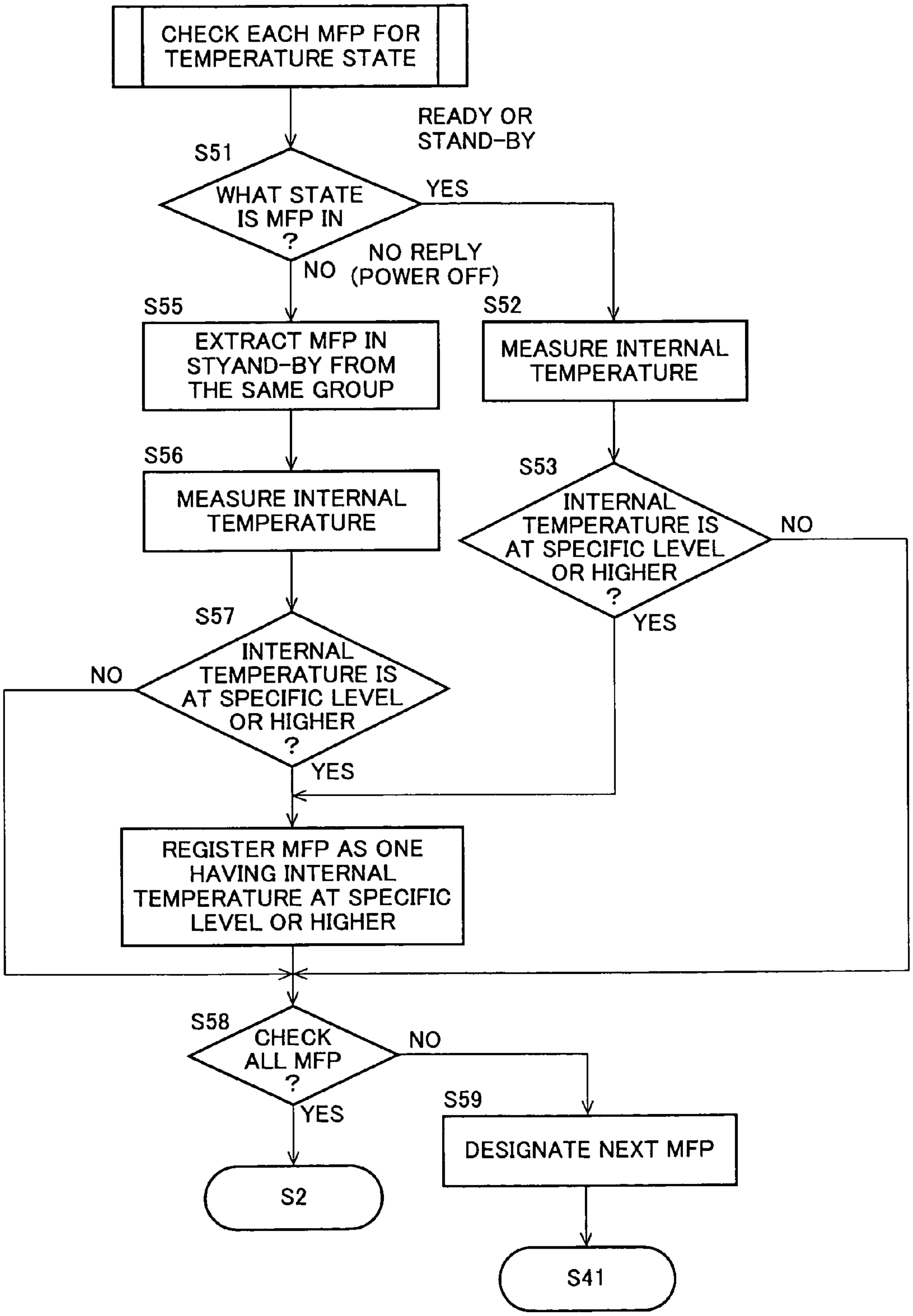
FIG. 11 is a flowchart showing the details of the step (S41) of checking the environmental state of each multifunction printer.

FIG. 11 is a flowchart showing the details of the step (S41) of checking the environmental state of each multifunction printer.

In the process at step 41 for checking the temperature of each multifunction printer, the printing server 30 checks each multifunction printer to see if a multifunction printer is in the ready state or in the stand-by state, or is incapable of replying to the printing server 30 (is not in the ready state) due to no power supply or other reasons (step 51). At step 51, when the multifunction printer 10 is in the ready state or stand-by state (YES at step 51), the printing server 30 measures the internal temperature of the multifunction printer 10 (step 52), and judges whether the internal temperature satisfies the given environmental condition shown in FIG. 2 (step 53). If the internal temperature satisfies the given environmental condition (YES at step 53), the printing server 30 registers the multifunction printer 10 with the control tables as a multifunction printer that satisfies the environmental condition requiring an internal temperature of a specific level or higher (step 54). If the multifunction printer 10 does not satisfy the environmental condition requiring an internal temperature of the specific level or higher at step 53 (NO at step 53), the printing server 30 ends a cycle of steps.

At step 51, when the multifunction printer 10 does not reply due to no power supply or other reasons, or replies but is not in the ready or stand-by state (NO at step 51), the printing server 30 picks out another multifunction printer 10 that is in the ready or stand-by state and belongs to the same group as the non-replying multifunction printer 10 (step 55), measures the internal temperature of the picked multifunction printer 10 (step 56), and judges whether the internal temperature is at the specific level or higher (step 57). If the internal temperature is at the specific level or higher (YES at step 57), the printing server 30 registers the picked multifunction printer 10 with the control tables as a multifunction printer that satisfies the environmental condition requiring an internal temperature at the specific level or higher (step 54). If the picked multifunction printer 10 does not satisfy the environmental condition requiring an internal temperature at the specific level or higher at step 57 (NO at step 57), the printing server 30 ends the cycle of steps.

According to the printing system of the second embodiment, a multifunction printer installed in an environment showing a high room temperature brings few causes for lowering a fixing temperature for a fixing device built in the multifunction printer. Printing data, therefore, is sent in priority to a multifunction printer installed in such an environment and print-out operation is executed. The printing system thus prevents a decline in printing efficiency due to a lower fixing temperature.

Figure 12:
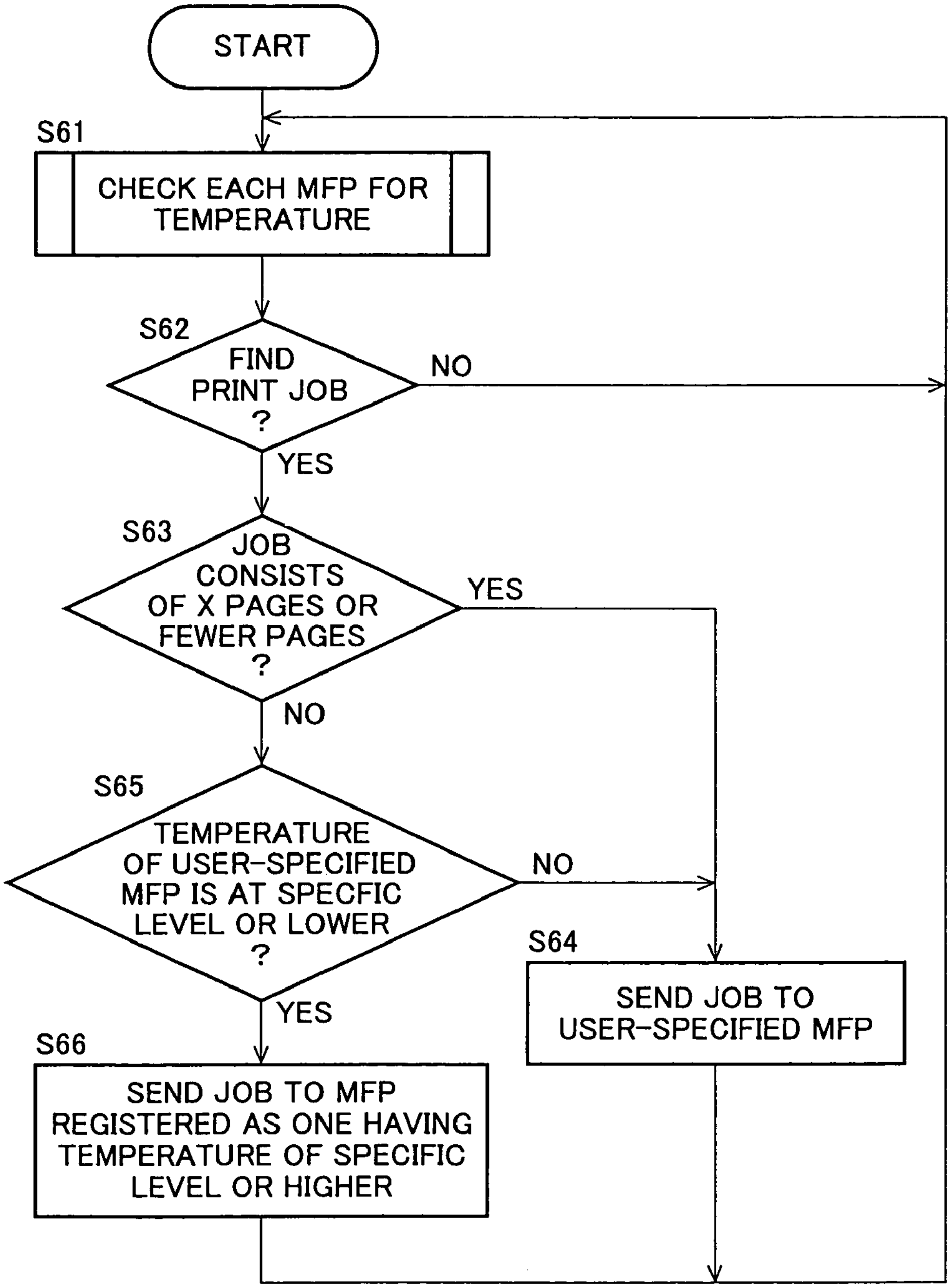
FIG. 12 is a flowchart depicting the process of controlling a multifunction printer based on an internal temperature.

FIG. 12 is a flowchart depicting a process of controlling a multifunction printer based on an internal temperature.

In the printing system according to the second embodiment, the printing server 30 checks each multifunction printer $\mathbf{10}_1$, $\mathbf{10}_2$, $\mathbf{10}_3$, - - - for the environmental state one after another to check the temperature of each multifunction printer (step 61). The printing server 30 then judges if there is a print job (step 62), and, when finding a print job to perform (YES at step 62), judges whether or not the print job consists of a preset given number or less number of pages (step 63). Judging the number of pages of the print job to be the given number or less (YES at step 63), the printing server 30 sends the print job to a multifunction printer that is specified by a user (step 64).

At step 63, if the umber of pages of the print job exceeds the given number (NO at step 63), the printing server 30 judges whether or not the internal temperature of the user-specified multifunction printer is at the specific level or lower (step 65), and, when it finds that the internal temperature is not at the specific level or lower (No at step 65), sends the print job to the user-specified multifunction printer (step 64). When the internal temperature of the user-specified multifunction printer is found to be at the specific level or lower at step 65 (YES at step 65), the printing server 30 sends the print job to a multifunction printer that is registered as one having an internal temperature of the specific level or higher (step 66).

A preset number is given to judge whether or not the amount of pages for a print job consists of the given number or less at step 63. That given number is changed according to the type of recording papers used for printing, such as regular paper, thick paper, or thin paper. When regular paper is used, the given number of 20 is adopted. When thick paper including OHP (Overhead Projector) sheet and postal card is used, the given number of 10 is adopted because a fixing roller shows a greater temperature decrease in a printing process.

Third Embodiment

Figure 13:
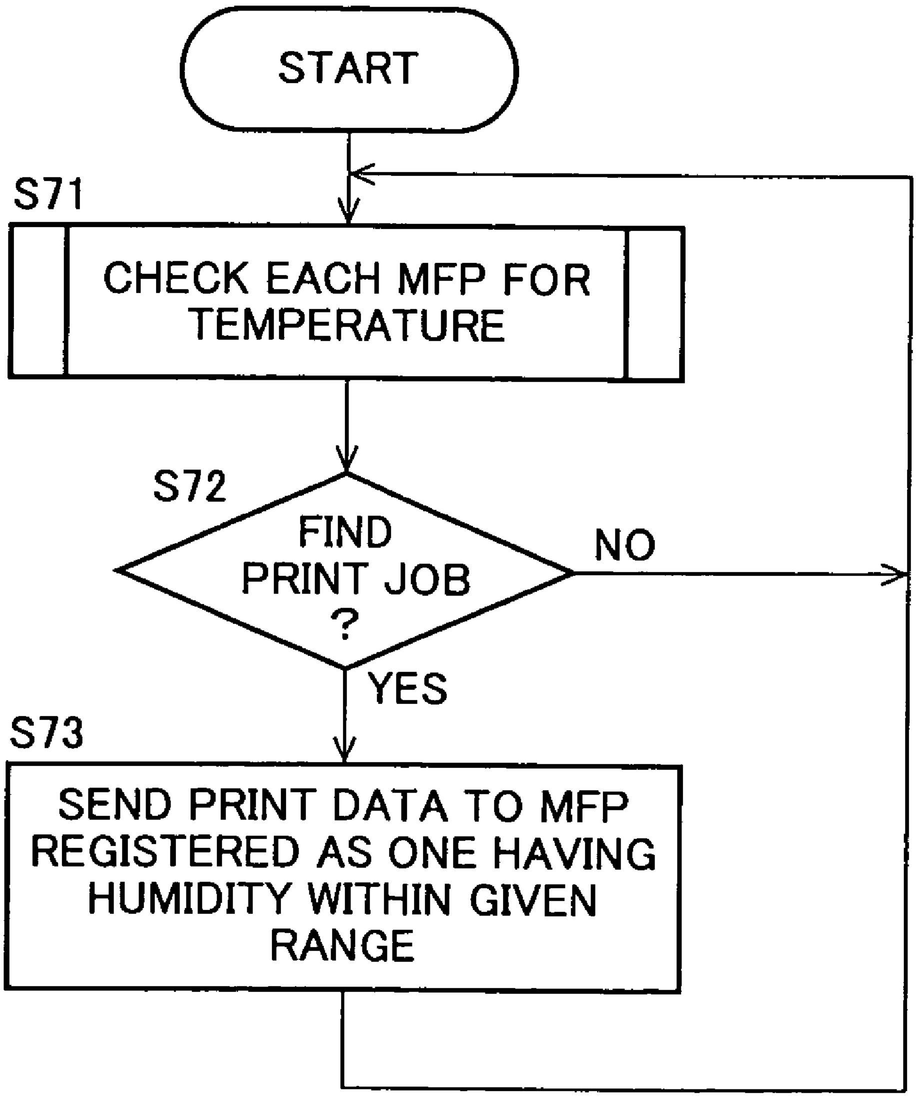
FIG. 13 is a flowchart depicting a process that the printing server checks and registers the humidity state of each multifunction printer, and sends printing data to the registered multifunction printer in the printing system according to a third embodiment.

FIG. 13 is a flowchart depicting a process that the printing server checks and registers the humidity state of each multifunction printer and sends printing data to the registered multifunction printer in the printing system according to a third embodiment.

In the printing system according to the third embodiment, the printing server 30 checks each multifunction printer $\mathbf{10}_1$, $\mathbf{10}_2$, $\mathbf{10}_3$, - - - for the environmental state one after another to check the humidity of each multifunction printer (step 71). The printing server 30 checks a print job from the personal computer 20 or the like connected to the printing server 30 via the network 40 (step 72). When the print job is sent to the printing server 30 (YES at step 72), the printing server 30 sends the print job to a multifunction printer registered as one that satisfies the given environmental condition as shown in FIG. 2, according to the humidity state of each multifunction printer that has been grasped at step 71 (step 73). When there is no print job at step 72 (NO at step 72), the printing server 30 returns to step 71 to check the humidity state of each multifunction printer.

Figure 14:
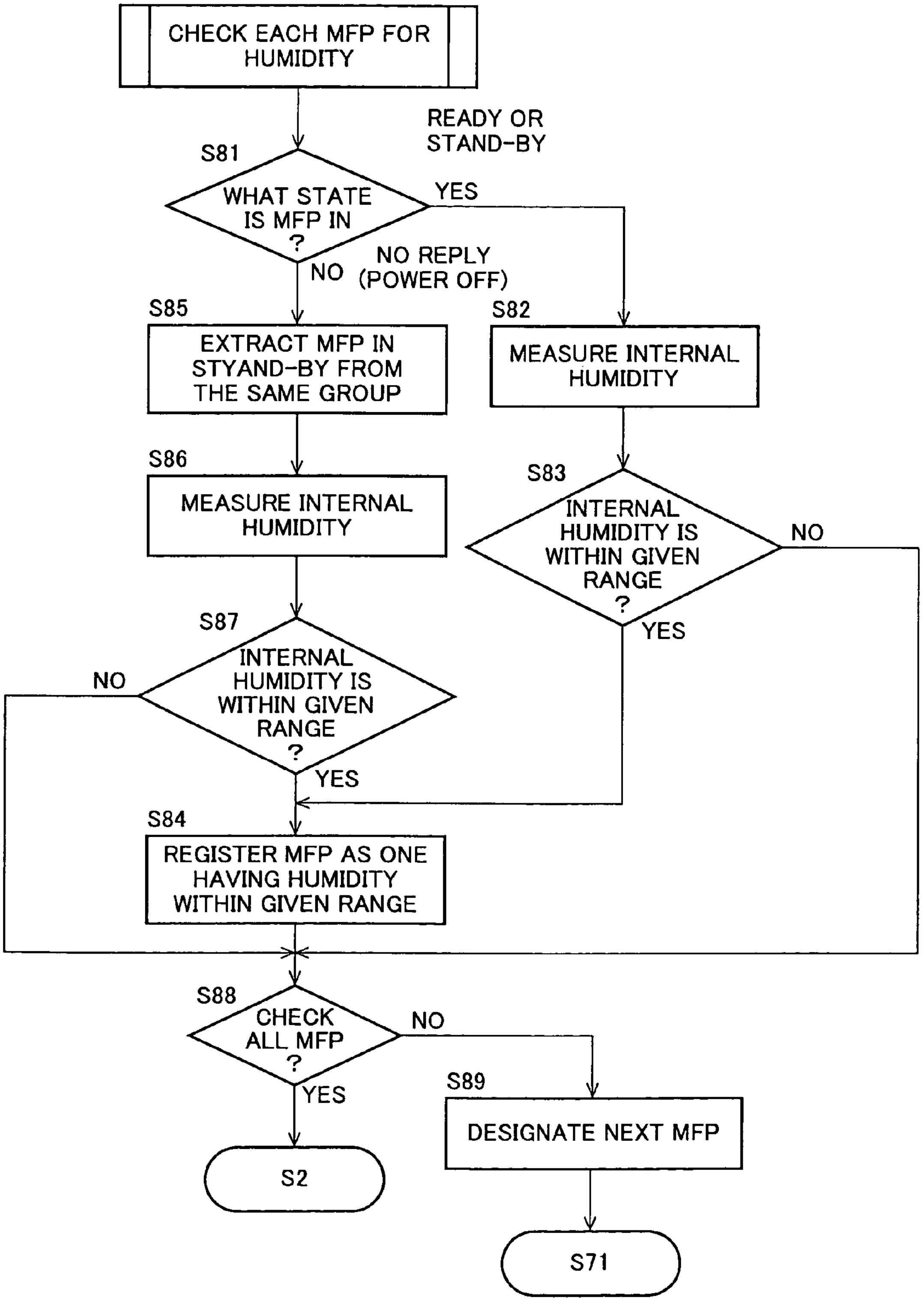
FIG. 14 is a flowchart showing the details of the step (S71) of checking the environmental state of each multifunction printer.

FIG. 14 is a flowchart showing the details of the step (S71) of checking the environmental state of each multifunction printer.

In the process at step 71 of checking the humidity of each multifunction printer, the printing server 30 checks each multifunction printer to see if the multifunction printer is in the ready state or in the stand-by state, or is incapable of replying to the printing server 30 (is not in the ready state) due to no power supply or other reasons (step 81). At step 81, when the multifunction printer 10 is in the ready state or stand-by state (YES at step 81), the printing server 30 measures the internal humidity of the multifunction printer 10 (step 82), and judges whether or not the internal humidity satisfies the given environmental condition shown in FIG. 2 (step 83). If the internal humidity satisfies the given environmental condition (YES at step 83), the printing server 30 registers the multifunction printer 10 with the control tables as a multifunction printer that satisfies the environmental condition requiring an internal humidity at a specific level or higher (step 84). If the multifunction printer 10 does not satisfy the environmental condition requiring an internal humidity at the specific level or higher at step 83 (NO at step 83), the printing server 30 ends a cycle of steps.

At step 81, when the multifunction printer 10 does not reply due to no power supply or other reasons, or replies but is not in the ready or stand-by state (NO at step 81), the printing server 30 picks out another multifunction printer 10 that is in the ready or stand-by state and belongs to the same group as the non-replying multifunction printer 10 (step 85), measures the internal humidity of the picked multifunction printer 10 (step 86), and judges whether or not the internal humidity is within a given range (step 87). If the internal humidity is within the given range (YES at step 87), the printing server 30 registers the picked multifunction printer 10 with the control tables as a multifunction printer that satisfies the environmental condition requiring an internal humidity at the specific level or higher (step 84). If the picked multifunction printer 10 does not satisfy the environmental condition requiring an internal humidity at the specific level or higher at step 87 (NO at step 87), the printing server 30 ends the cycle of steps.

According to the printing system of the third embodiment, a multifunction printer installed in an environment showing the humidity within the given range brings few causes for stored recording papers to absorb moisture of the specific level or higher or to stick together due to static electricity. The printing system thus prevents a decline in printing efficiency caused by an operational jam that happens as the papers absorb moisture or stick together.

Figure 15:
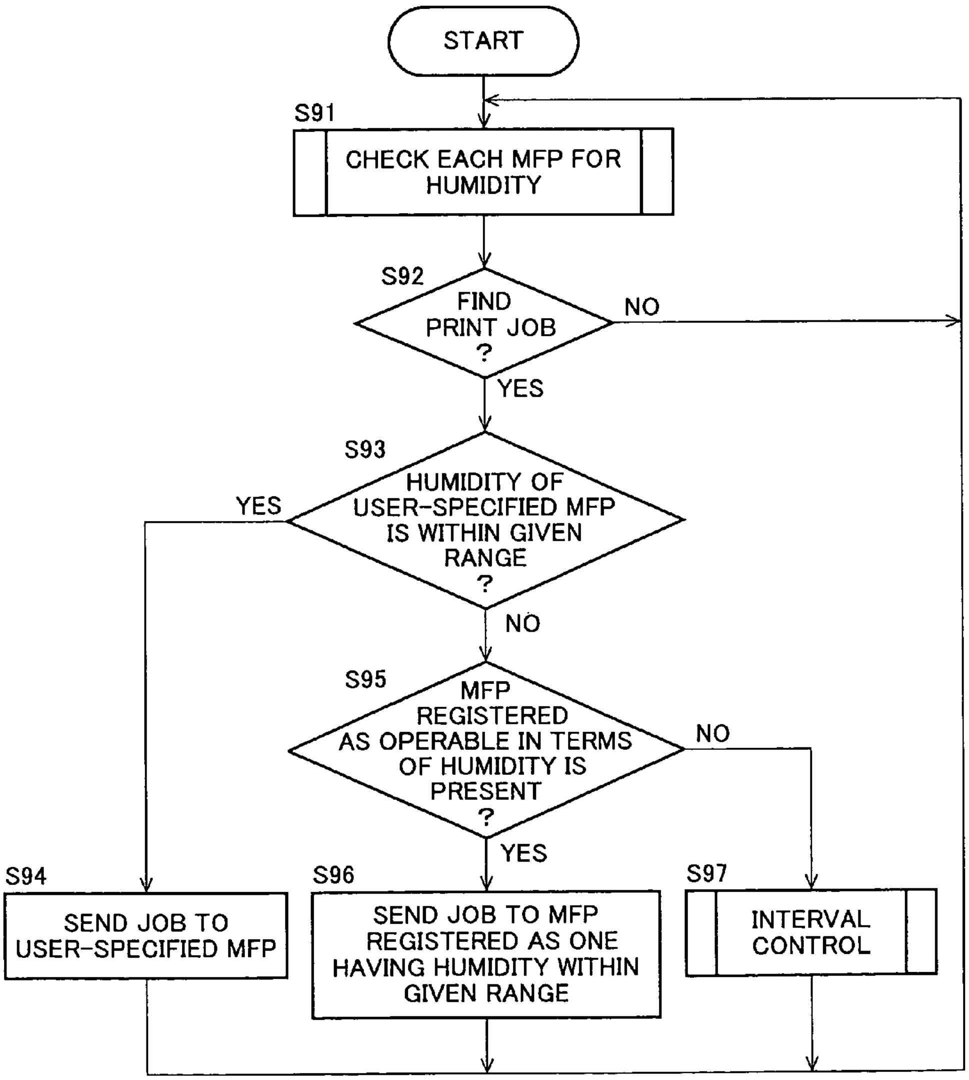
FIG. 15 is a flowchart depicting a process of controlling a multifunction printer based on an internal humidity value.

FIG. 15 is a flowchart depicting a process of controlling a multifunction printer based on an internal humidity value.

In the printing system according to the third embodiment, the printing server 30 checks each multifunction printer $\mathbf{10}_1$, $\mathbf{10}_2$, $\mathbf{10}_3$, - - - for the environmental state one after another to check the humidity of each multifunction printer (step 91). The printing server 30 then judges if there is a print job (step 92), and, when it finds a print job to perform (YES at step 92), judges whether or not the humidity of an operational environment for a user-specified multifunction printer is within the given range (step 93). Judging the humidity of the operational environment to be within the given range (YES at step 93), the printing server 30 sends the print job to the user-specified multifunction printer (step 94).

At step 93, if the humidity of the user-specified multifunction printer is not within the given range (NO at step 93), the printing server 30 judges the presence or nonpresence of a multifunction printer that is registered as one having the humidity within the given range (step 95). Finding the multifunction printer that is registered as one having the humidity within the given range (YES at step 95), the printing server 30 sends the print job to such a multifunction printer (step 96). At step 95, when it finds no multifunction printer that is registered as such (No at step 95), the printing server 30 carries out interval control.

A lack of an available multifunction printer is concluded when no multifunction printer registered as one having the operational environment humidity within the given range is found at step 95. In this case, interval control is carried out to use a multifunction printer that does not have the humidity within the given range, and, therefore, is not registered, but has humidity close to the given range.

Figure 16:
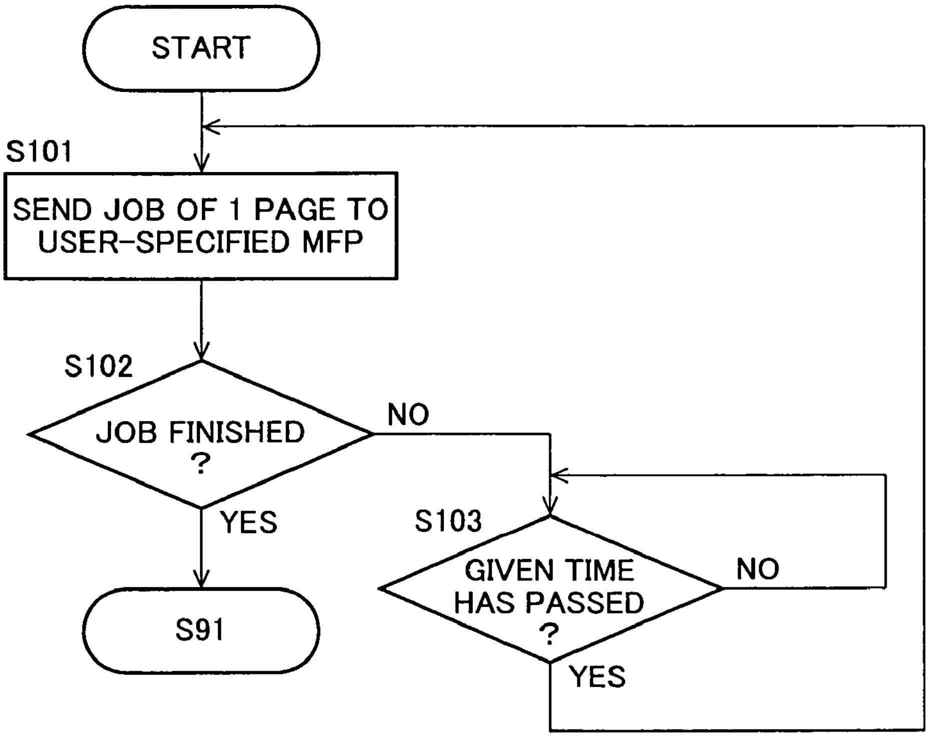
FIG. 16 is a flowchart depicting a process that a multifunction printer carries out interval printing.

FIG. 16 is a flowchart depicting a process that a multifunction printer carries out interval printing.

A multifunction printer usually considered to be unusable is used under interval control. This requires the prevention of an operational failure during a printing process, for which reason interval printing is carried out to reduce printing load. According to interval printing, the printing server 30 reads printing data stored for a multifunction printer out of a buffer in the printing server 30, and sends a job of one page to the multifunction printer (step 101). The printing server 30 then checks to see if the job is finished (step 102), and ends a cycle of steps when it finds out that the job is finished. If the job is not finished, the printing server 30 checks to see if a given time has passed (step 103), and returns to step 101 after the given time has passed, then starts processing the next job.

Fourth Embodiment

Not using image forming devices not in a given operational environment limits a number of operable image forming devices, thus hampers office work using the image forming devices. To solve this problem, the printing system according to a fourth embodiment actuates only the bedewing preventive mechanisms of image forming devices in an environmental condition for bedewing among image forming devices interconnected via the network. In this manner, the printing system prevents bedewing with less power consumption and turns inoperable image forming devices to operable ones.

In the printing system according to the fourth embodiment, the printing server 30 checks each multifunction printer $\mathbf{10}_1$, $\mathbf{10}_2$, $\mathbf{10}_3$, - - - for bedewing, and sends a signal to a multifunction printer considered to be one with bedewing in progress so as to make the multifunction printer actuate the bedewing preventive mechanism including the insulation heater 15 and the blast fan 16. Once a given time has passed since the bedewing preventive mechanism was put into operation, the printing server 30 judges that bedewing has been cleared and the multifunction printer is now capable of printing out. A lens heater, a sheet heater, a blast fan, etc. can be named as specific examples of the bedewing preventive mechanism. A specific means and location for the bedewing preventive mechanism, however, are decided properly according to the structure of an image forming device.

Figure 17:
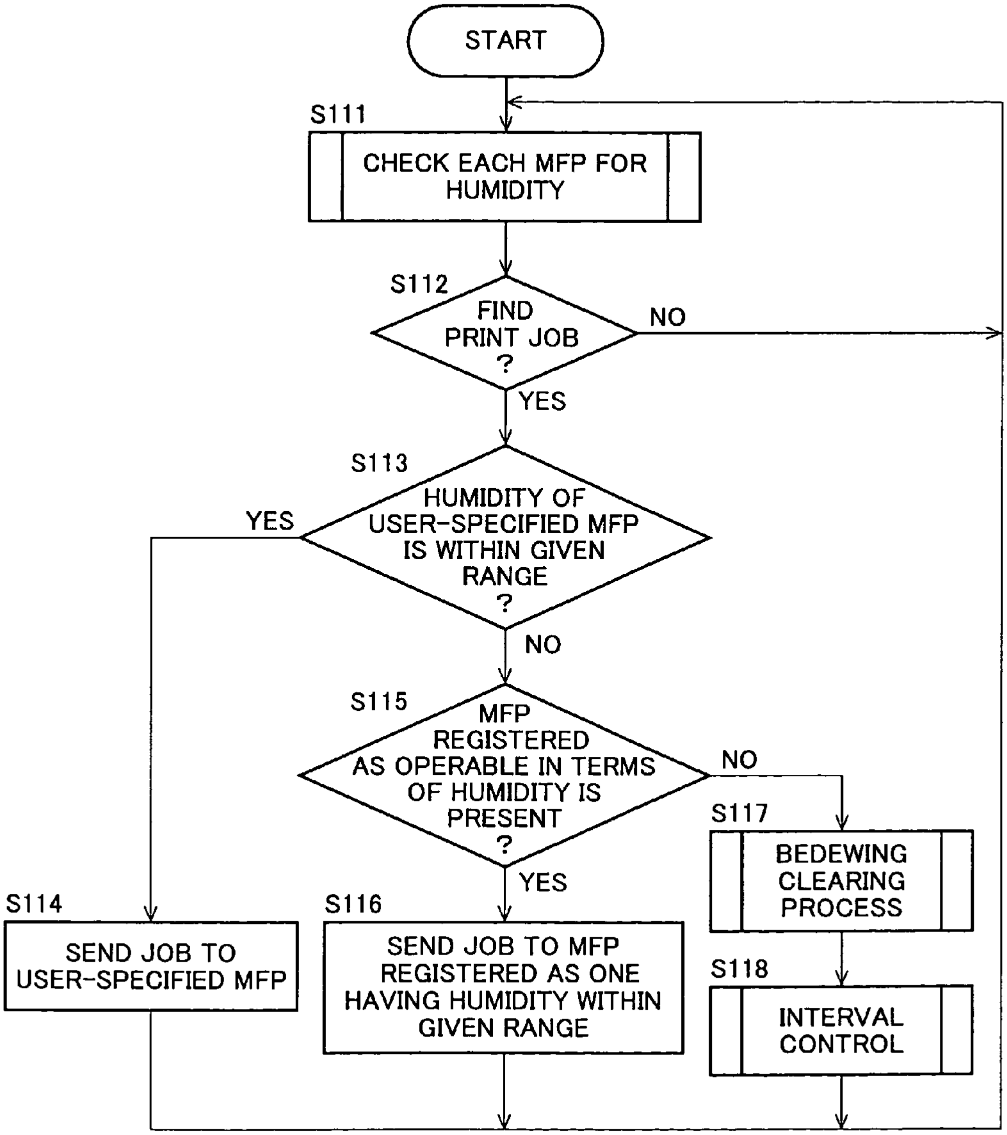
FIG. 17 is a flowchart depicting a process including a process of turning an inoperable image forming device to operable one when a plurality of image forming devices include inoperable image forming devices in the printing system according to a fourth embodiment.

FIG. 17 is a flowchart depicting a process including a process of turning an inoperable image forming device to operable one when a plurality of image forming devices include inoperable image forming devices in the printing system according to the fourth embodiment.

The printing server 30 checks each multifunction printer 10 for the bedewing state one after another to grasp the bedewing state of each multifunction printer 10 (step 111). When it receives a print job (step 112) the printing server 30 checks to see if the operational environment of a user-specified multifunction printer is within the given humidity range (step 113). When it finds the operational environment to be within the given humidity range, the printing server 30 sends the print job to the user-specified multifunction printer (step 114).

At step 113, if the operational environment of the user-specified multifunction printer is not within the given humidity range, the printing server 30 checks if there is a multifunction printer that is registered as one within the given humidity range (step 115). Finding a multifunction printer registered as such, the printing server 30 sends the print job to the registered multifunction printer (step 116).

When no registered multifunction printer is found at step 115 (No at step 115), the printing server 30 energizes a fixing device incorporated into an inoperable multifunction printer to raise the internal temperature of the printer body (step 117) in executing a bedewing clearing process or the like that turns the inoperable multifunction printer to operable one. In addition, the printing server 30 executes interval control, which is described in section 0091, to reduce load on the multifunction printer under the bedewing clearing process, and then proceeds to printing operation (step 118).

Figure 18:
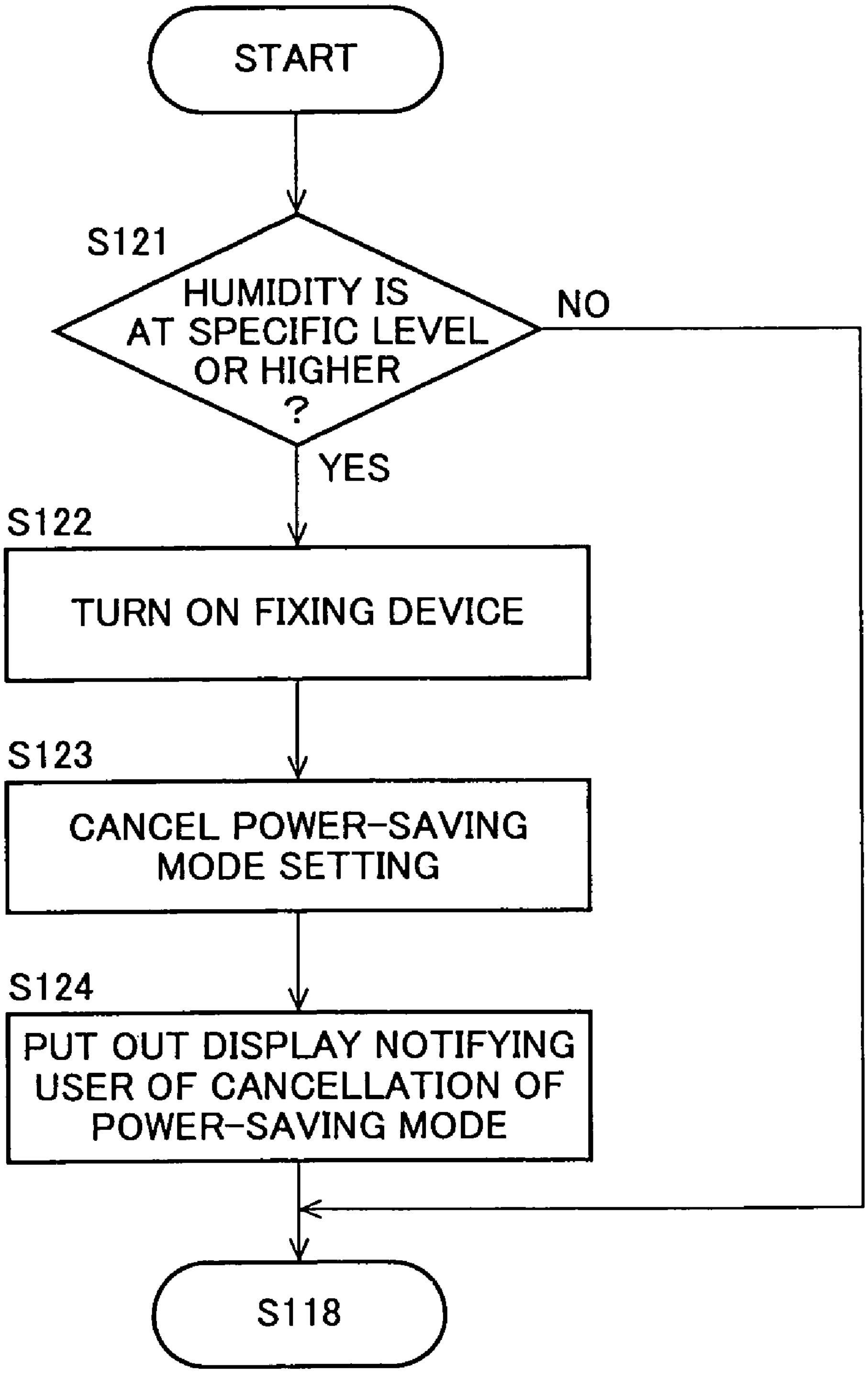
FIG. 18 is a flowchart depicting a process that the printing server carries out a bedewing clearing process.

FIG. 18 is a flowchart depicting a process that the printing server carries out the bedewing clearing process.

The printing server 30 checks to see if the humidity of the operational environment of a multifunction printer is at the specific level or higher (step 121). When it finds that the humidity of the operational environment is at the specific level or higher (YES at step 121), the printing server 30 sends a command for energizing the fixing device to the multifunction printer (step 122), and cancels the power-saving mode (step 123). The printing server 30 then puts out a display that notifies a user of the cancellation of the power-saving mode setting (step 124), and ends a cycle of steps.

Figure 19:
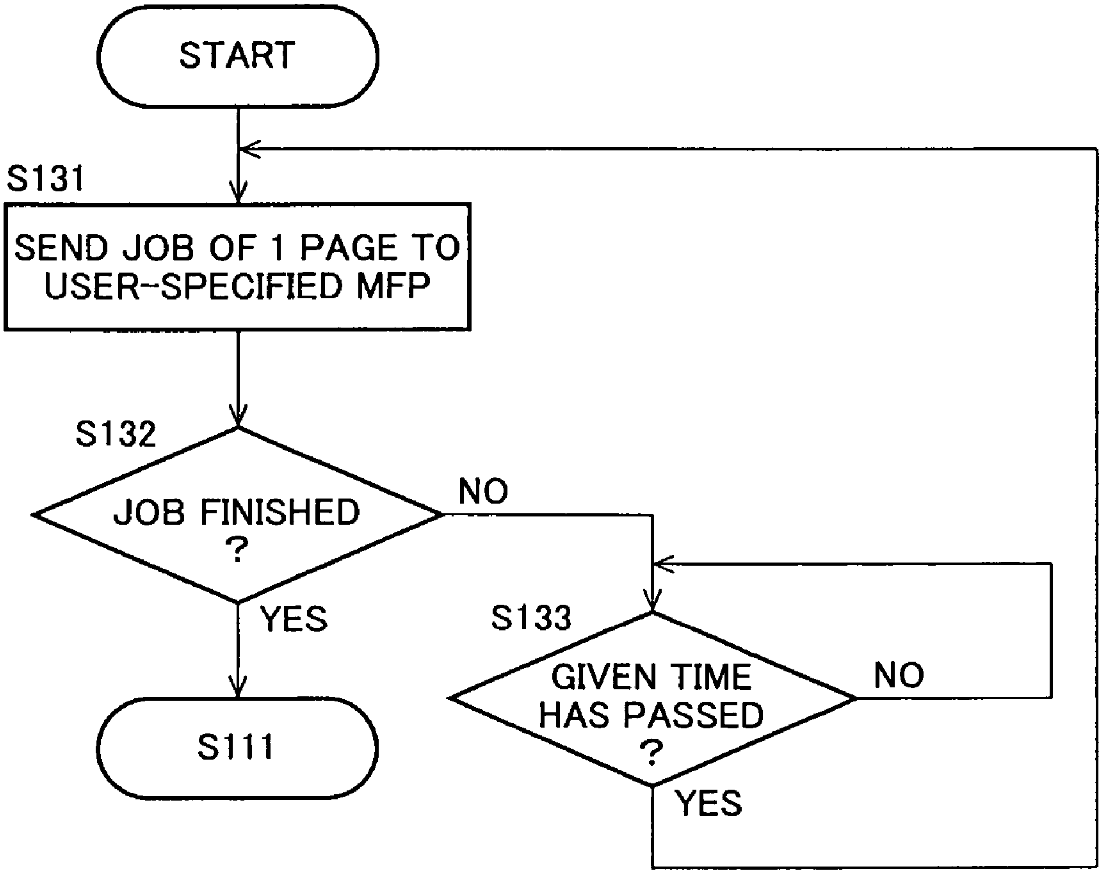
FIG. 19 is a flowchart depicting a process that a multifunction printer carries out interval printing.

FIG. 19 is a flowchart depicting a process that a multifunction printer carries out interval printing.

As described before, the interval printing which reduces printing load is performed to an inoperable multifunction printer turned into operable one by energizing a heater of the fixing device in the bedewing clearing process in order to prevent an operational failure during printing operation. Accordingly, at step 118 shown in FIG. 17, the printing server 30 reads printing data stored for a multifunction printer out of the buffer in the printing server 30, and sends a job of one page to the multifunction printer turned into operable one (step 131). The printing server 30 then checks to see if the job is finished (step 132), and ends a cycle of steps when it finds out that the job is finished. If the job is not finished, the printing server 30 checks to see if the given time has passed (step 133), and returns to step 131 after the given time has passed, then starts processing the next job.

Fifth Embodiment

A state of an image forming device can be judged based on the temperature and humidity of an operational environment the image forming device is in. When the operational environment fluctuates, however, the state of the image forming device must be judged in consideration of the history of temperature and humidity as well as the current temperature and humidity. When an image forming device is in an operational environment accompanying certain fixed humidity, the state of the image forming device changes depending on whether the temperature is increasing or decreasing, and the image forming device may be bedewed when the temperature is decreasing. Accordingly, the printing system according to a fifth embodiment judges the state of each image forming device accurately in consideration of the history of an operational environment for the image forming device and controls the image forming device. The cases where humidity histories are considered are described in the following.

Figure 20:
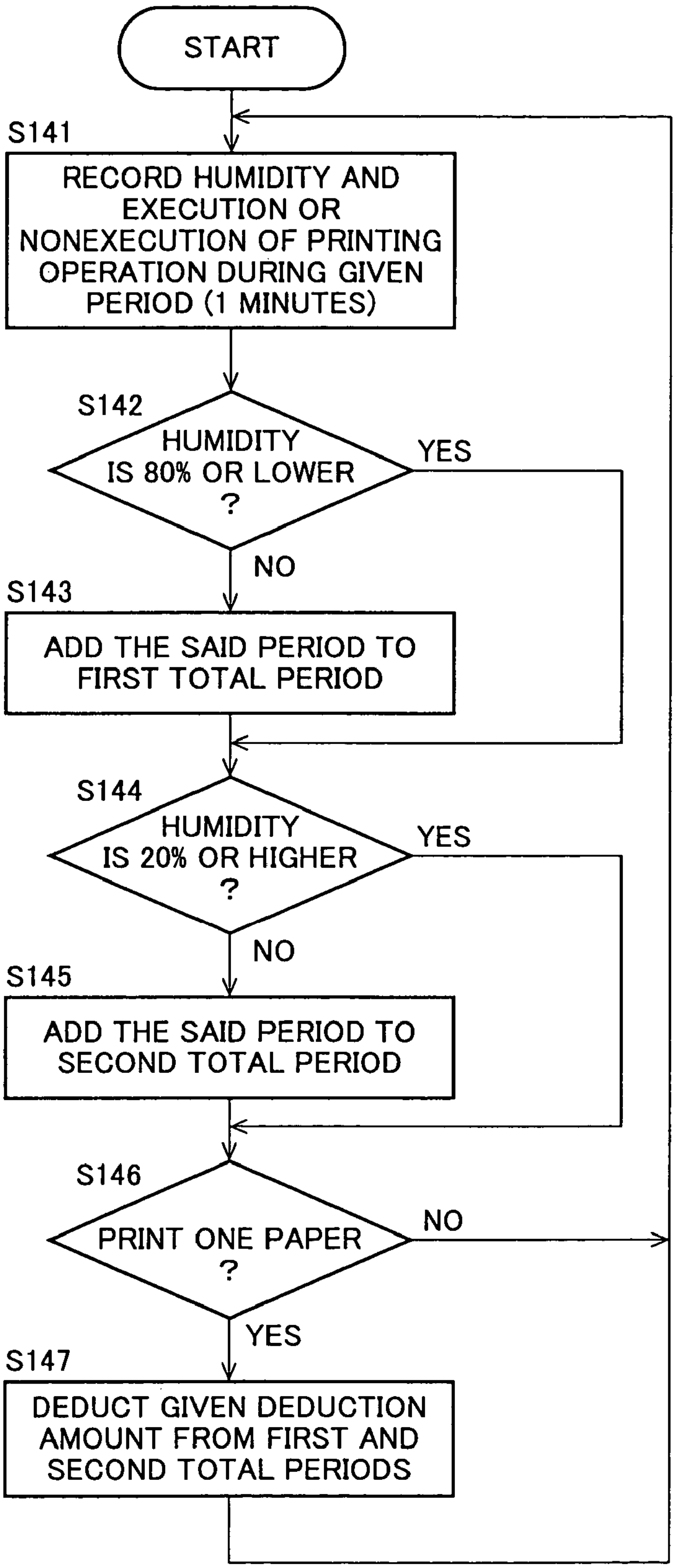
FIG. 20 is a flowchart depicting a process of recording the operational environment history of each multifunction printer in control tables in the printing system according to a fifth embodiment.

FIG. 20 is a flowchart depicting a process of recording the operational environment history of each multifunction printer in the control tables in the printing system according to the fifth embodiment.

FIGS. 21A, 21B are graphic diagrams showing respective control tables on the printing server. FIG. 21A exhibits the control table for each multifunction printer, while FIG. 21B exhibits the control table for cassettes incorporated into each multifunction printer.

In the process of recording the history of the operational environment for each multifunction printer, as shown in FIG. 20, for example, a first total period, which is the sum of the period during which a given (relative) humidity measures 80% or higher, and a second total period, which is the sum of the period during which the given humidity measures 20% or lower, are added up and recorded for each image forming device, i.e., multifunction printer, and for each cassette incorporated into the image forming device.

The printing server records the humidity of the operational environment and the fact if the printing operation is performed during a given period (e.g. one minute) for each image forming device (step 141). The printing server then checks to see if the humidity is 80% or lower (step 142), and when the humidity is 80% or lower, proceeds to step 144. On the other hand, when the humidity exceeds 80%, the printing server writes the time duration of such humidity in the first total period columns in the control tables on the printing server, as shown in FIGS. 21A, 21B, in addition to the previous record (step 143), and proceeds to step 144. Subsequently, the printing server checks to see if the humidity is 20% or higher (step 144), and when the humidity is 20% or higher, proceeds to step 146. When the humidity is lower than 20%, the printing server writes the time duration of such humidity in the second total period columns in the control tables on the printing server in addition to the previous record (step 145), and proceeds to step 146.

At steps 143, 145, when either or both of the first and second total periods add up to a given period (e.g. 8 hours) or longer period, the printing server judges that an image forming device under such a condition is out of the given environmental condition. The printing server then issues a control command for (1) not sending printing data, (2) changing a printing condition (for example, to interval control), and (3) raising the internal temperature of the device.

As the first and second total periods are accumulated as long as an image forming device is on operation, the recording paper is the one that is affected principally by humidity. The recording paper, however, is consumed in the course of printing operation, and once consumed the printed paper becomes irrelevant to the humidity history. Because of this, applying the total period which is the past history to the recording paper stored in the image forming device at the present point leads to an inconsistency. To solve this inconsistency, the time corresponding to the number of recording papers consumed (printed recording papers) must be deducted from the first and second total periods. The deduction must be made in such a way that, for example, when the maximum storage capacity of the paper feeding cassette is 250, each total period comes to zero at the point that 250 papers have been printed out. This brings a deduction time of approximately 2 minutes per printed paper, which is given by 8 hours×60 minutes÷250.

Accordingly, at step 146, the printing server checks to see if a recording paper is printed, and, when it is printed, deducts the given deduction time from total periods written in the first and second total period columns. When the recording paper is not printed at step 146, the printing server returns to step 141.

The example described above is the process of checking each image forming device to see if the device's operational environment is within the given humidity range. In the case that each cassette incorporated into the image forming device is checked one by one to see if the cassette is within the given humidity range, it is more preferable that a total period for humidity is calculated for each cassette and the deduction is made according to a specific cassette to be used because the image forming device is provided with a plurality of cassettes having different maximum storage capacities. Hence making judgment for each cassette whether it satisfies the given environmental condition or not brings more accurate result.

Sixth Embodiment

The printing system according to a sixth embodiment judges whether or not bedewing is in progress on each multifunction printer $\mathbf{10}_1$, $\mathbf{10}_2$, $\mathbf{10}_3$, - - - on the basis of the operational state of each multifunction printer. Even if the temperature/humidity sensors 14 built in each multifunction printer happens to indicate the same measurement, a temperature change in the printer body caused by an external environmental element tends to be greater when the multifunction printer is in the energy saving mode which the fixing heater attached to the fixing device is off than when the printer is in an operational state with the said fixing heater being on, therefore, a possibility of bedewing is likely to be greater in the energy saving mode. On the other hand, when the multifunction printer is on operation with the fixing heater being on, the fixing heater works as a sort of insulation heater to warm up inside the printer body and keeps the internal temperature of the printer body relatively higher than that of the printer body with the fixing heater being off in many cases. The temperature/humidity sensors 14 are set at one certain spot in the printer body, so the measurements given by the sensors 14 fluctuate in response to a local change in temperature and humidity.

Seventh Embodiment

A distributed printing system according to a seventh embodiment achieves the above objects of the invention in the following manner.

A plurality of multifunction printers $\mathbf{10}_1$, $\mathbf{10}_2$, $\mathbf{10}_3$ - - - connected to the network 40 acquire individual operational environment information, and send the acquired operational environment information to the printing server 30. The printing server 30 judges the operational environment state of each image forming device, i.e., multifunction printer, based on the operational environment information received via the network 40, decides the assignment of an amount of a distributed printing job to each multifunction printer $\mathbf{10}_1$, $\mathbf{10}_2$, $\mathbf{10}_3$ - - - according to individual operational environment state, and sends printing data to each multifunction printer for printing out.

Figure 22:
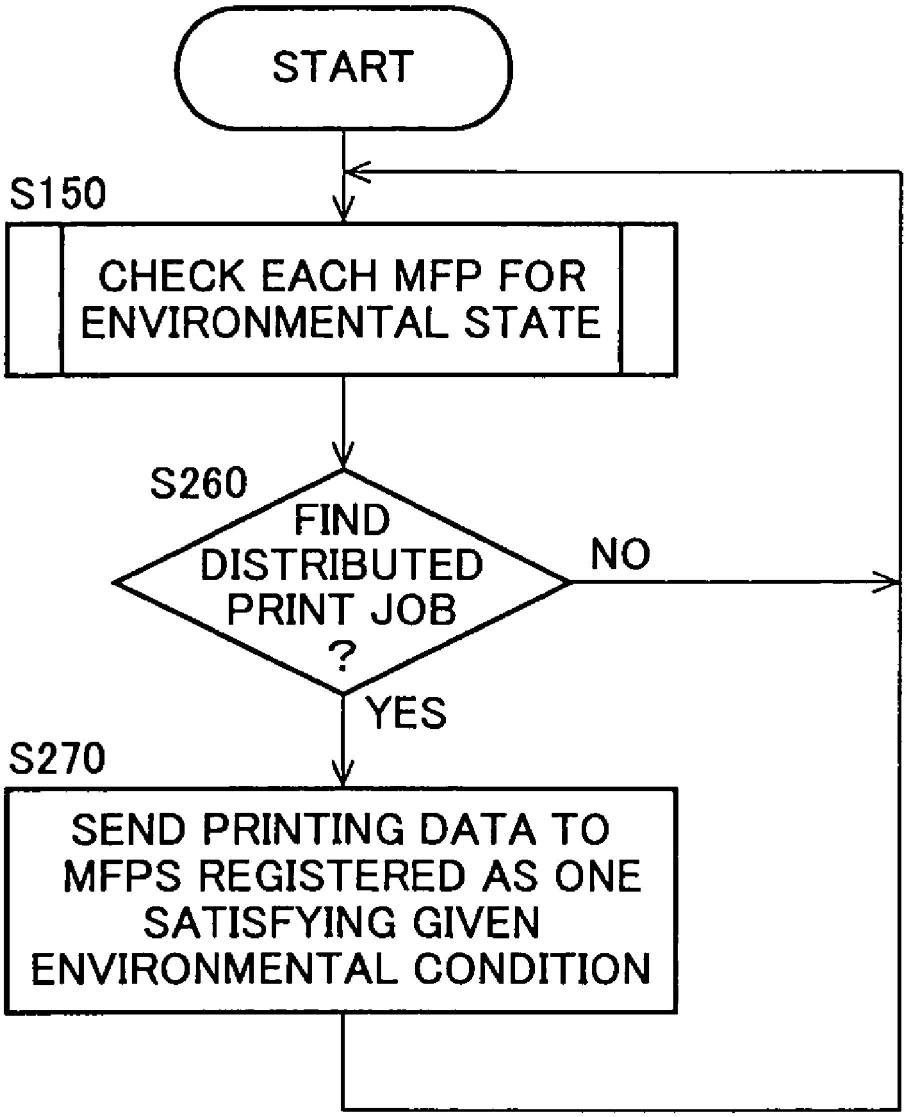
FIG. 22 is a flowchart depicting a process that the printing server sends printing data to a multifunction printer after considering the environmental state of each multifunction printer in the distributed printing system according to a seventh embodiment.

FIG. 22 is a flowchart depicting a process that the printing server sends printing data to a multifunction printer after considering the environmental state of each multifunction printer in the distributed printing system according to the seventh embodiment.

The printing server 30 in the printing system according to the seventh embodiment checks each multifunction printer $\mathbf{10}_1$, $\mathbf{10}_2$, $\mathbf{10}_3$, - - - for the environmental state one after another on the basis of each environmental information sent by the multifunction printer, and grasps the environmental state of each multifunction printer (step 150). The printing server 30 checks a print job from the personal computer 20 or the like connected to the printing server 30 via the network 40 (step 260). When the print job is sent to the printing server 30 (YES at step 260), the printing server 30 sends a distributed print job to a multifunction printer that is in a state of capable of printing operation, according to the environmental state of each multifunction printer that has been grasped at step 150 (step 270). When there is no print job at step 260 (NO at step 260), the printing server 30 returns to step 150.

Figure 23:
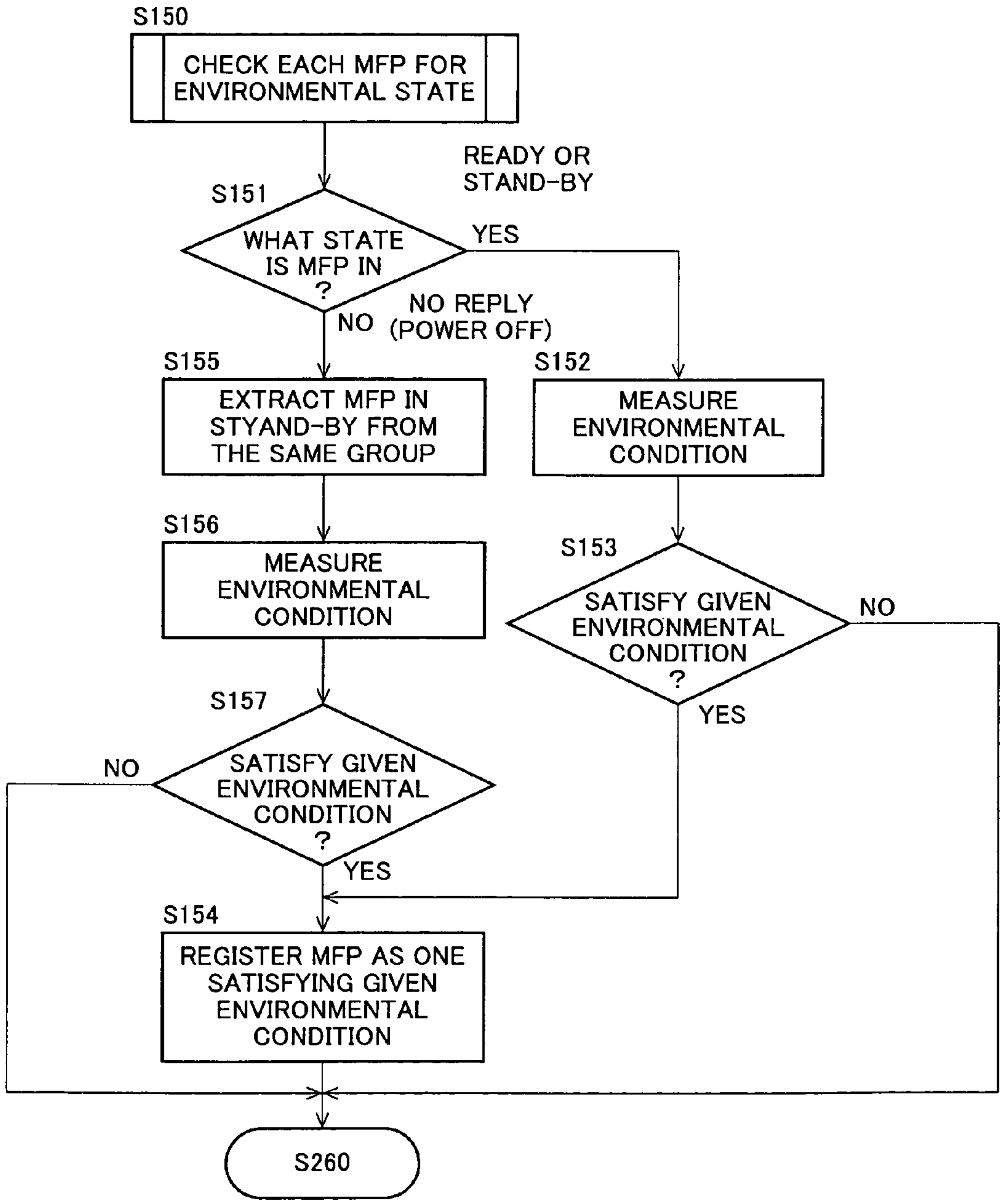
FIG. 23 is a flowchart showing the details of the step (S150) of checking the environmental state of each multifunction printer.

FIG. 23 is a flowchart showing the details of step (S150) of checking the environmental state of each multifunction printer.

In the process for grasping the bedewing state of each multifunction printer $\mathbf{10}_1$, $\mathbf{10}_2$, $\mathbf{10}_3$, - - - , the printing server 30 checks to see if a multifunction printer is in the ready state or in the stand-by state, or is cut off from the power supply to be incapable of replying to the printing server 30 (not in the ready state) (step 151). The ready state means that the multifunction printer is ready to start immediately as it is kept at a constant temperature with the heater of the fixing device being energized. The stand-by state means that the multifunction printer is in the energy saving mode as it is supplied with power but is under no temperature control with the heater being not energized.

At step 151, when the printing server 30 finds the multifunction printer 10 is in the ready or stand-by state (YES at step 151), the printing server 30 acquires the operational environment information from multifunction printer 10 (step 152), and analyzes the information to see if it satisfies the condition indicated in the range of the operational environmental condition shown in FIG. 2 (step 153). If the results of the analysis satisfies such given condition (YES at step 153), the printer server 30 registers the multifunction printer 10 as one that satisfies the given operational environmental condition (step 154), and proceeds to step 260 shown in FIG. 22. If the results of the analysis does not satisfy the given operational environmental condition at step 153 (No at step 153) because of bedewing of the multifunction printer 10 or the like, the printer server 30 proceeds directly to step 260 shown in FIG. 22.

At step 151, when the multifunction printer 10 does not reply to the printing server 30 because of no power supply or other reasons (No at step 151), the printing server 30 picks out another multifunction printer 10 that is in the ready or stand-by state and belongs to the same group as the non-replying multifunction printer 10 (step 155), acquires the operational environment information from the picked multifunction printer 10 (step 156), and analyzes the acquired information to see if it satisfies the condition indicated in the range of the operational environmental condition shown in FIG. 2 (step 157). If the results of the analysis satisfies such given condition (YES at step 157), the printer server 30 registers the picked multifunction printer 10 as one that satisfies the given operational environmental condition (step 154), and proceeds to step 260 shown in FIG. 22. If the analyzed information does not satisfy the given operational environmental condition at step 157 (No at step 157) due to bedewing of the multifunction printer 10 or the like, the printer server 30 proceeds directly to step 260 shown in FIG. 22.

Eighth Embodiment

Figure 24:
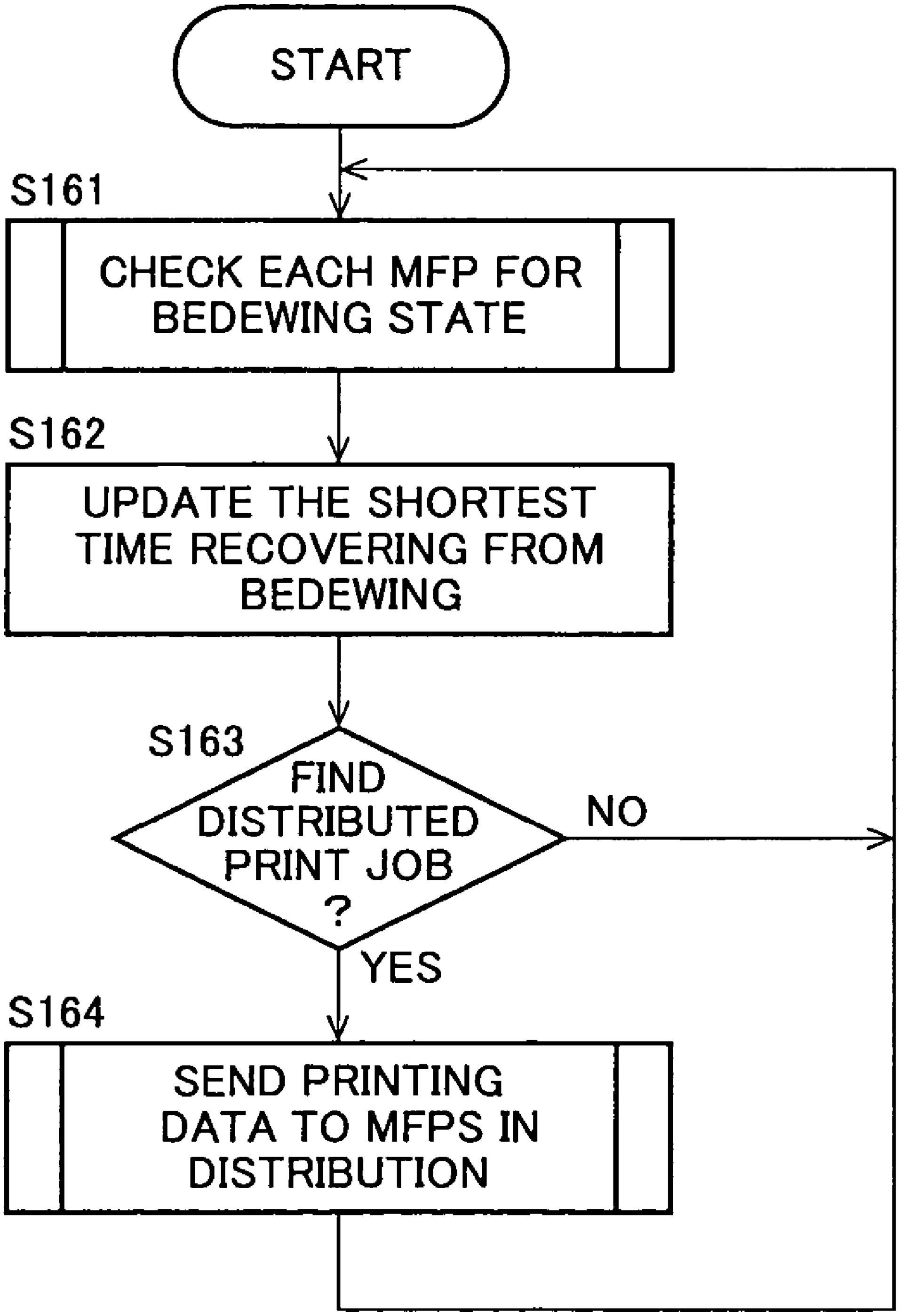
FIG. 24 is a flowchart depicting a process of sending distributed printing data to a multifunction printer in a bedewing state in the distributed printing system according to a eighth embodiment.

FIG. 24 is a flowchart depicting a process of sending distributed printing data to a multifunction printer in the bedewing state in the distributed printing system according to an eighth embodiment.

The printing server 30 in the printing system according to the eighth embodiment checks each multifunction printer 10 to see if it is in the bedewing state or not (step 161), calculates the shortest return time needed for a multifunction printer 10 which is judged to be in the bedewing state to clear bedewing (step 162), and memorizes that shortest return time. The shortest return time for a multifunction printer 10 in the bedewing state to clear bedewing is calculated in the following manner.

The printing server 30 has the control tables as shown in FIGS. 9A, 9B to put each multifunction printer 10 under control, and refers to bedewing clearing time parameters consisting of "time passage in state of left alone", "time passage from start of ready state", and "dehumidifier operating time" in reference to each control table. The printing server 30 extracts the parameter that is the nearest to that of clearing bedewing, and calculates the shortest bedewing clearing time Tcnd (x).

The printing server 30 then checks if there is a print job for distributed printing (step 163). If the print job for distributed printing is present (YES at step 163), the printing server 30 makes a decision on assigning distributed print jobs to operable multifunction printers without bedewing in consideration of the capacity, environmental state, etc. of each multifunction printer, and sends out print jobs assigned to each multifunction printer (step 164). A method for assigning print jobs to multifunction printers according to the capacity, environmental state, etc. of each multifunction printer will be described later.

Figure 25:
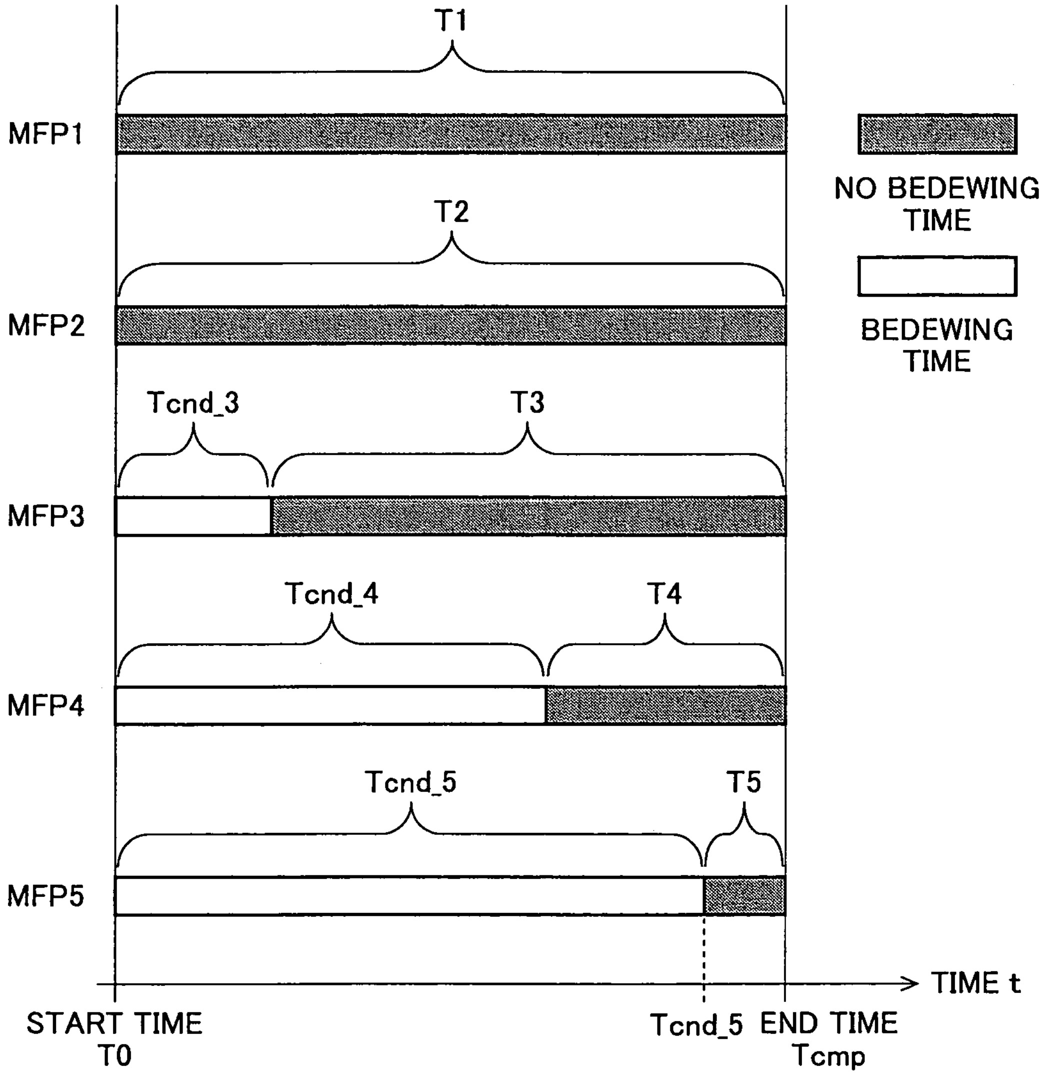
FIG. 25 is a time chart for synchronizing the print finishing time of each multifunction printer in the distributed printing system.

FIG. 25 is a time chart for synchronizing the print finishing time of each multifunction printer in the distributed printing system.

The distributed printing system according to the eighth embodiment includes 5 multifunction printers MFP1 to MFP5, and the multifunction printers MFP 1, 2 are operable from the start but the multifunction printers MFP 3 to 5 are bedewed to be incapable of operating, as shown in FIG. 25. In this case, even if the printing server instructs the multifunction printers MFP 3 to 5 to actuate their insulation heaters, blast fans, etc. to clear the dew condensation, the multifunction printers MFP 3 to 5 cannot be operated from the start. The multifunction printers MFP 3 to 5 becomes operable when respective periods of Tcnd_3, Tcnd_4, Tcnd_5 have passed and the dew concentration on multifunction printers MFP 3 to 5 is cleared out.

In the above case, the printer server calculates each print job quota to be assigned to each multifunction printer MFP 1 to 5, and sends out each calculated assigned job according to the processing capacity and the bedewing state of each multifunction printer MFP 1 to 5. Hence the distributed printing jobs can be started at a time T0 and ended at a time Tcmp simultaneously, using the multifunction printers MFP 1 to 5.

Figure 26:
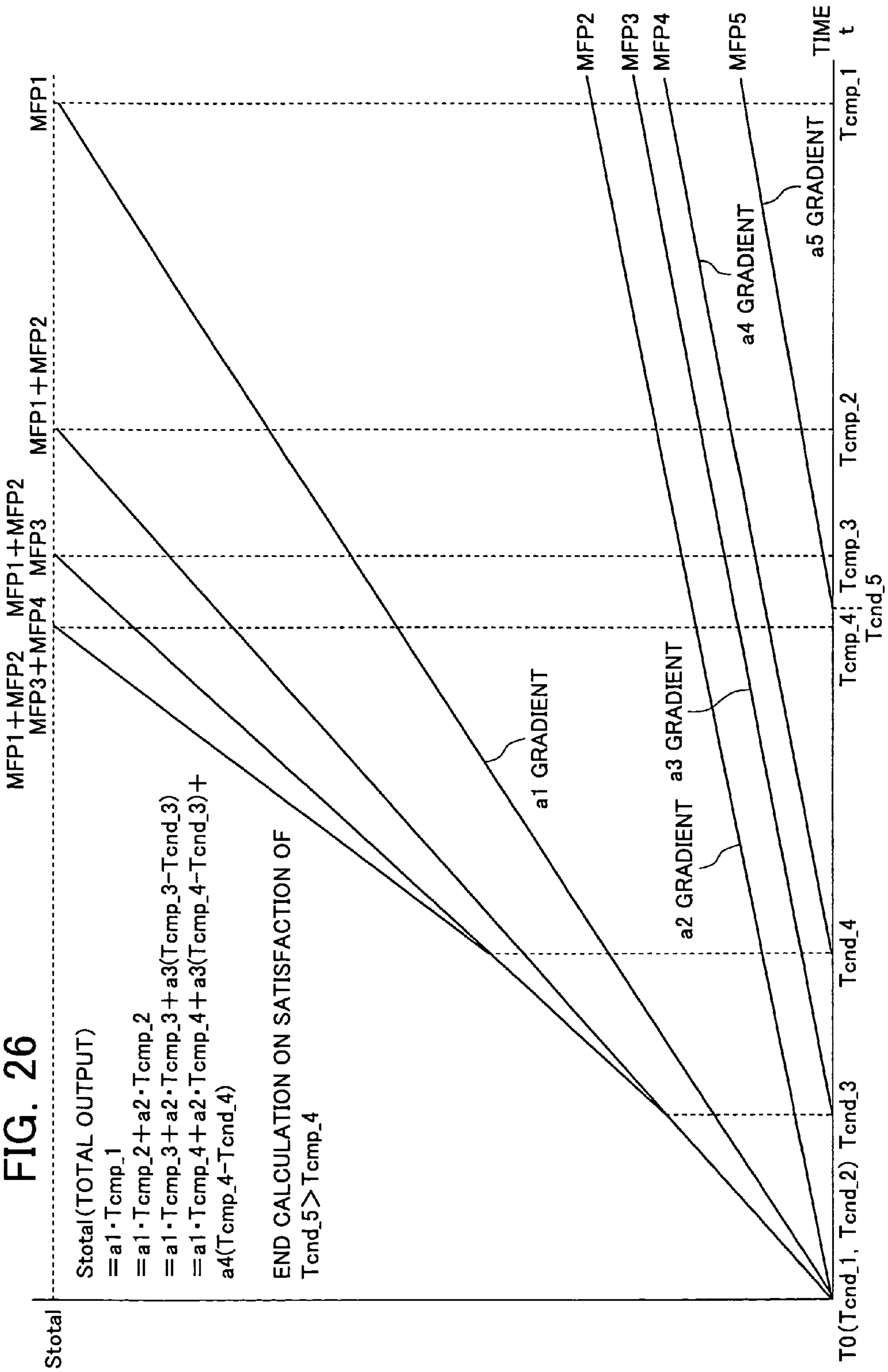
FIG. 26 is a graph showing the way each multifunction printer executes printing when distributed printing is carried out using a plurality of multifunction printers shown in FIG. 25.

FIG. 26 is a graph showing the way each multifunction printer executes printing when distributed printing is carried out using a plurality of multifunction printers shown in FIG. 25.

FIG. 26 represents an example of a print job executed by distributed printing using the multifunction printers MFP 1 to 5, where the number of papers to be printed is $S_{total}$. The multifunction printers MFP 1 to are put into operation separately according to the environmental state of each printer in such a manner that the multifunction printers MFP 1, 2 are put into operating at the time T0, MFP 3 at the time Tcnd_3, MFP 4 at the time Tcnd_4, and MFP 5 at the time Tcnd_5. The printing capacity of each multifunction printer is represented by the gradient a1 to a5 of each straight line, which indicates that the multifunction printer MFP 1 is the fastest in processing and the highest in job efficiency.

At the start of the distributed printing, the multifunction printers MFP 1, MFP 2 are put into operation, and, at the time Tcnd_3, the multifunction printer MFP 3 is cleared of bedewing and is put into operation, then, at the time Tcnd_4, the multifunction printer MFP 4 is cleared of bedewing and is put into operation. As the distributed printing using the multifunction printers MFP 1 to 4 proceeds, the total number of papers printed reaches the designated number of $S_{total}$ at the time Tcmp_4, at which printing operation comes to an end. In the example represented by FIG. 26, the number of printed papers has reached $S_{total}$ before the multifunction printer MFP 5 clears itself of bedewing, so that multifunction printer MFP 5 is not used.

Figure 27:
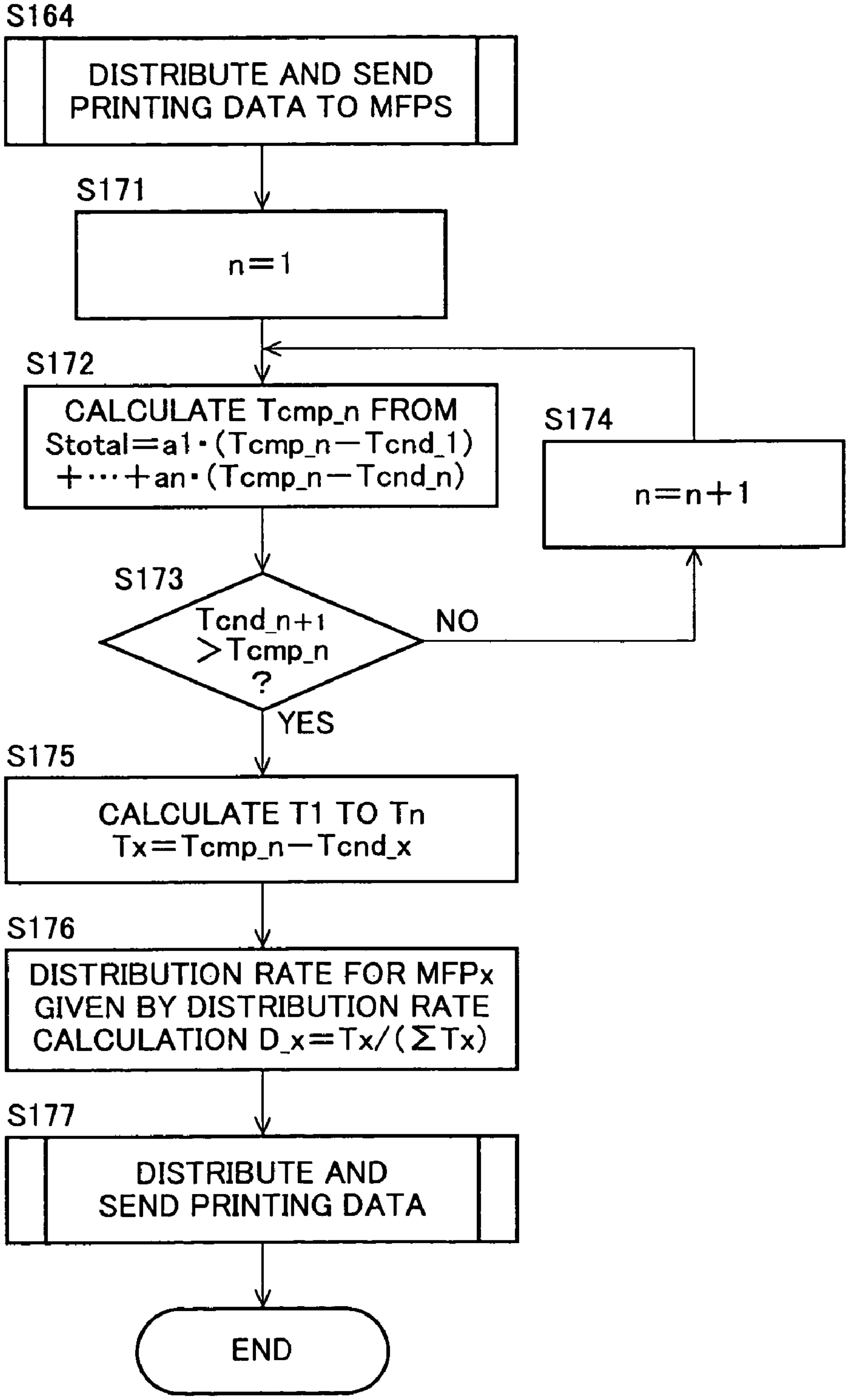
FIG. 27 is a flowchart showing the details of a step (S164) for sending assigned data to a plurality of multifunction printers.

FIG. 27 is a flowchart showing the details of the step (S164) for sending assigned data to a plurality of multifunction printers.

An initial value 1 is substituted into the total number n of multifunction printers (step 171), and $S_{total}$=a1·(Tcmp_n−Tcnd_1)+a2·(Tcmp_n−Tcnd_1)+ - - - +an·(Tcmp_n−Tcnd_n) is calculated to determine the time Tcmp_n at which printing of papers numbering $S_{total}$, is finished (step 172), then satisfaction of Tcnd_n+1>Tcmp_n is checked (step 173). If Tcnd_n+1>Tcmp_n is not satisfied at step 173 (No at step 173), n+1 is substituted for n (step 174) and the calculation at step 172 is repeated. When Tcnd_n+1>Tcmp_n is satisfied at step 173 (YES at step 173), T1 to T5 are calculated based on Tx=Tcmp_n−Tcnd_x (step 175). In the example represented by FIG. 26, the multifunction printers MFP 1 to 4 are used by the completion of printing of papers numbering in Stotal to give a condition of n=4, which yields a result of T1=Tcmp_4−Tcnd_1, T2=Tcmp_4−Tcnd_2, T3=Tcmp_4−Tcnd_3, T4=Tcmp_4−Tcnd_4. Following to this, a printing data distribution rate D_x for MFP1 to MFPn is calculated based on D_x=Tx/ΣTx (step 175).

Since the example represented by FIG. 26 gives the condition of n=4, ΣTx=T1+T2+T3+T4 is obtained, which provides a result of D_1=T1/ΣTx, D_3=T3/ΣTx, D_4=T4/ΣTx.

The printing data is distributed among each multifunction printer MFP according to the calculated distribution rate D_x, and each distributed portion of the printing data is sent to each multifunction printer (step 177).

Figure 28:
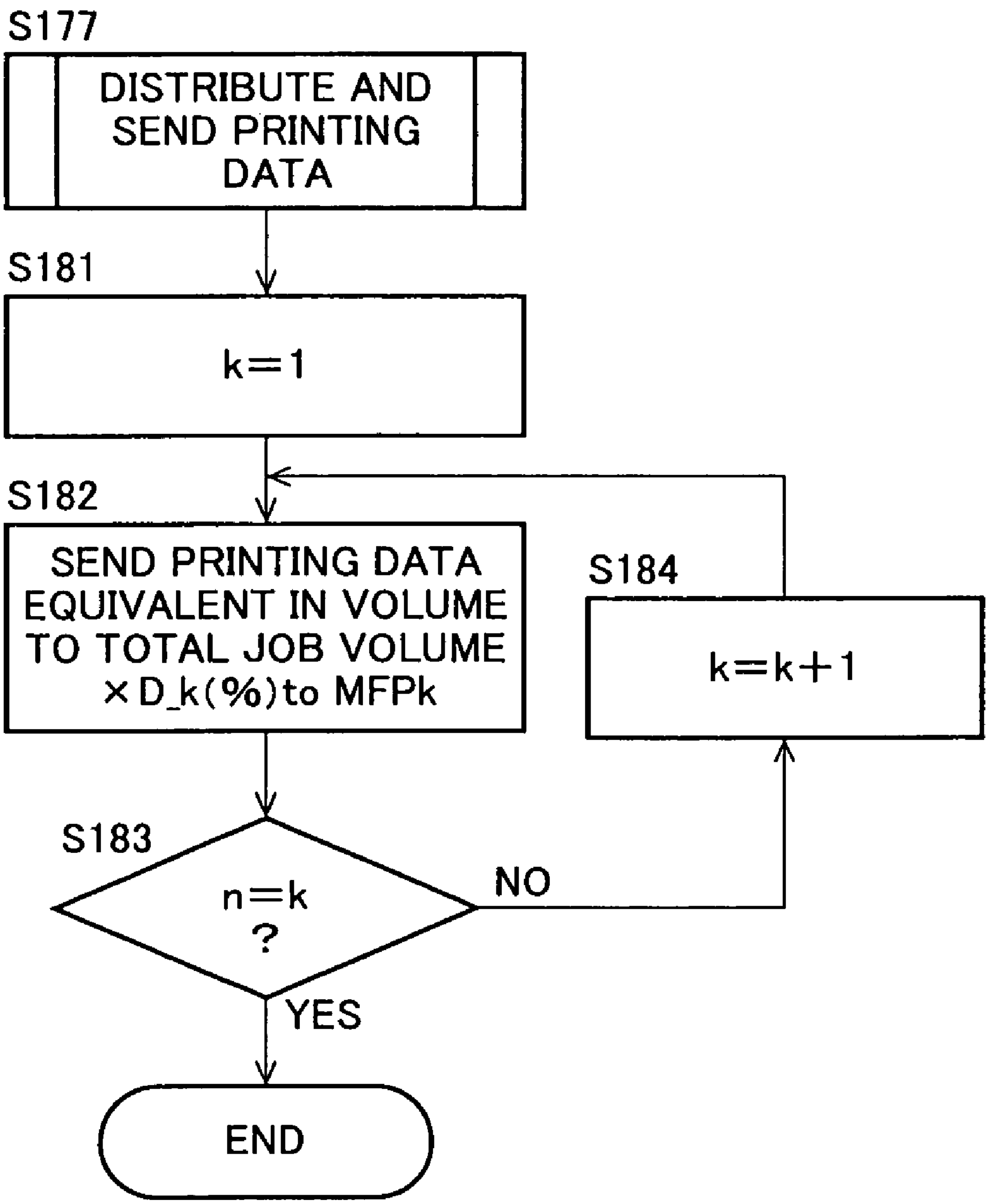
FIG. 28 is a flowchart showing the details of the step (S177) of distributing and sending printing data to each multifunction printer.

FIG. 28 is a flowchart showing the details of the step (S177) of distributing and sending printing data to each multifunction printer.

An initial value 1 is substituted into a variable k (step 181), and printing data equivalent in volume to total job volume×D_k (%) is sent to a multifunction printer MFPk (step 182), and satisfaction of n=k is checked (step 183). If n=k is not satisfied at step 183, k+1 is substituted for k (step 184), and the calculation at step 182 is repeated. When n=k is satisfied at step 183 (YES at step 183), a cycle of steps is ended.

Ninth Embodiment

Figure 29:
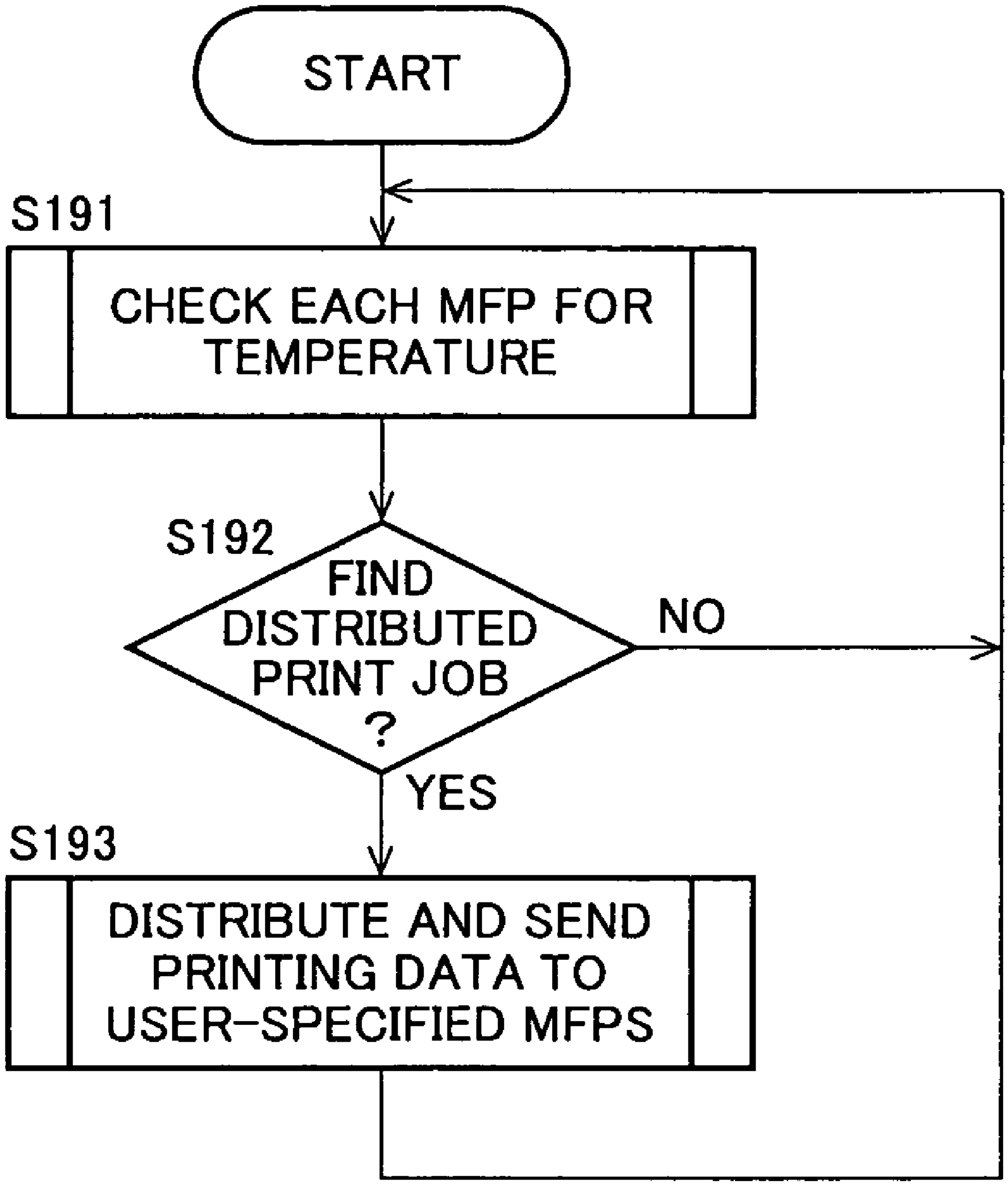
FIG. 29 is a flowchart depicting a process of distributing and sending printing data to each multifunction printer on the basis of the temperature state of the multifunction printer in the distributed printing system according to a ninth embodiment.

FIG. 29 is a flowchart depicting a process of distributing and sending printing data to each multifunction printer on the basis of the temperature state of the multifunction printer in the distributed printing system according to a ninth embodiment.

The printing server checks each multifunction printer MFP for temperature information one after another, based on each piece of temperature information sent from each multifunction printer, to check the environmental state of each multifunction printer MFP (step 191). When a print job is sent from the personal computer or the like to the system via the network or the like (YES at step 192), the printing server distributes and sends printing data to user-specified multifunction printers MFP on the basis of the environmental state of each MFP that is checked at step 191 (step 193). When no print job is sent to the system at step 192, the printing server returns to step 191.

At step 193, the printing server distributes and sends the printing data to the user-specified multifunction printers MFP on the basis of the environmental state of each MFP. At this time, among the user-specified multifunction printers MFP, when a distribution coefficient DSTR_k for a multifunction printer having an internal temperature of 15 C.° or higher to 35 C.° or lower is set to be 100, a distribution coefficient DSTR_k for a multifunction printer having an internal temperature of lower than 15 C.° or over 35 C.° is, for example, set to be 20 for data distribution. Distribution coefficient DSTR_k is given as an approximate value, but distribution rate D_k can be calculated from D_k=DSTR_k/ΣDSTR_k when the total number of multifunction printers for data distribution is set to be n. ΣDSTR_k stands for the total of distribution coefficients given by DSTR_1 to DSTR_n.

For example, when a distribution coefficient DSTR_1 for the multifunction printer MFP1 is 100 and a distribution coefficient DSTR_2 for the multifunction printer MFP2 is 20, a distribution rate D_1 for the multifunction printer MFP1 is given by DSTR_1/(DSTR_1+DSTR_2).

Figure 30:
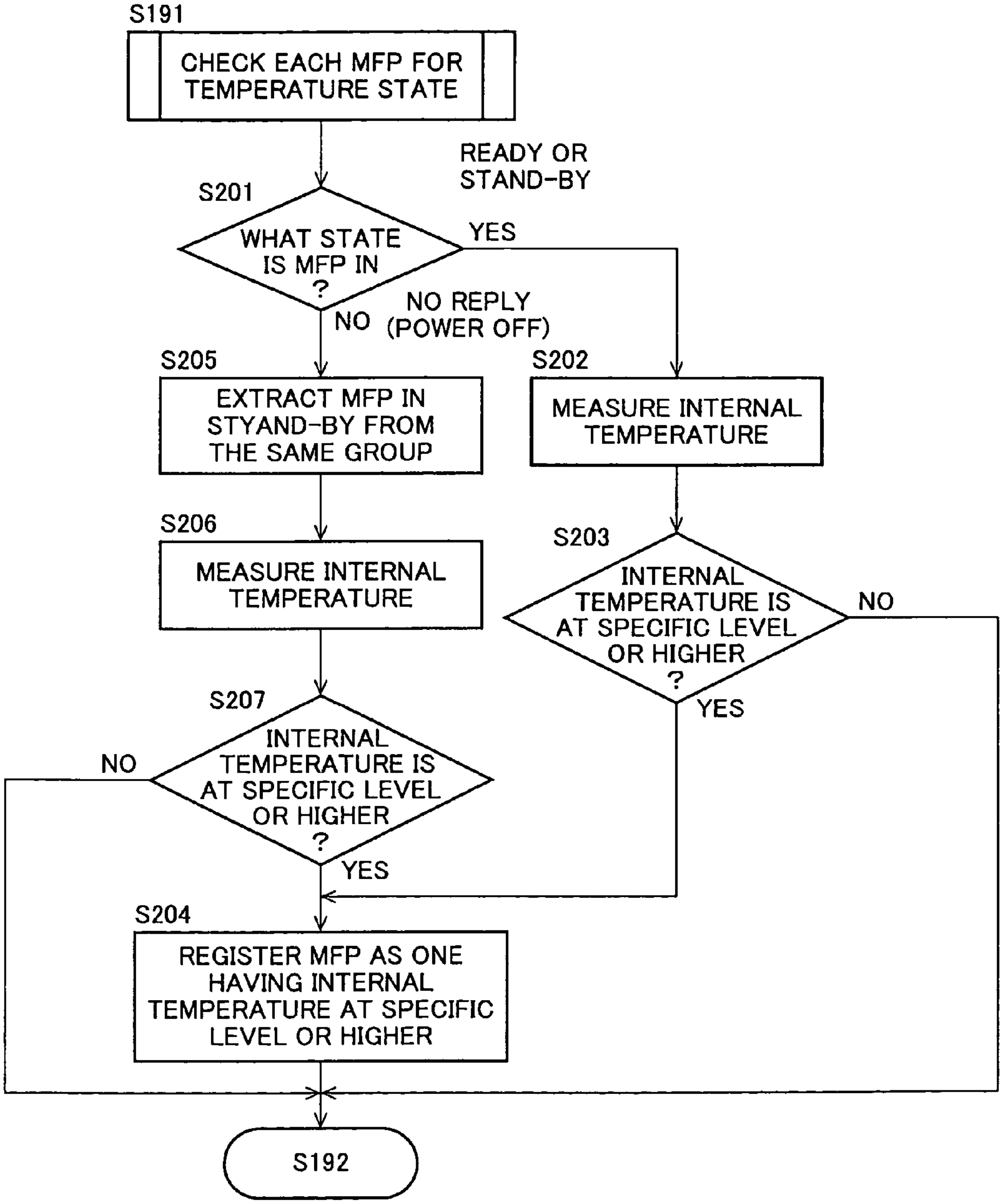
FIG. 30 is a flowchart showing the details of the step (S191) of checking the temperature state of each multifunction printer.

FIG. 30 is a flowchart showing the details of the step (S191) of checking the temperature state of each multifunction printer In the process at step 191 for checking the temperature state of each multifunction printer MFP, the printing server checks each multifunction printer MFP to see if the multifunction printer MFP is in the ready state or in the stand-by state, or is incapable of replying to the printing server (is not in the ready state) because of no power supply or other reasons (step 201). At step 201, when the multifunction printer MFP is in the ready state or stand-by state (YES at step 201), the printing server acquires temperature information including measurement of an internal temperature from the multifunction printer MFP (step 202), and judges whether or not the multifunction printer MFP satisfies the condition indicated by the range of the operational environment condition shown in FIG. 2 (15 C. ° or higher to 35 C.° or lower) on the basis of the temperature information (step 203). If the multifunction printer MFP satisfies the condition shown in FIG. 2 (YES at step 203), the printing server registers the multifunction printer MFP as one that satisfies the given operational environmental condition (step 204), and proceeds to step 192 shown in FIG. 29. If the multifunction printer MFP does not satisfy the given operational environmental condition (NO at step 203), the printing server proceeds directly to step 192 shown in FIG. 29.

At step 201, when the multifunction printer MFP does not reply to the printing server because of no power supply or other reasons, (NO at step 201), the printing server picks out another multifunction printer MFP that is in the ready or stand-by state and belongs to the same group as the non-replying multifunction printer MFP (step 205), acquires temperature information from the picked multifunction printer MFP (step 206), and judges whether or not the picked multifunction printer MFP satisfies the temperature condition that is within the range of the operational environment condition shown in FIG. 2 (step 207). If the picked multifunction printer MFP satisfies the temperature condition (YES at step 207), the printing server registers the picked multifunction printer MFP as one that satisfies the given operational environment condition (step 204), and proceeds to step 192 shown in FIG. 29. If the picked multifunction printer MFP does not satisfy the temperature condition at step 207, the printing server proceeds directly to step 192 shown in FIG. 29.

Figure 31:
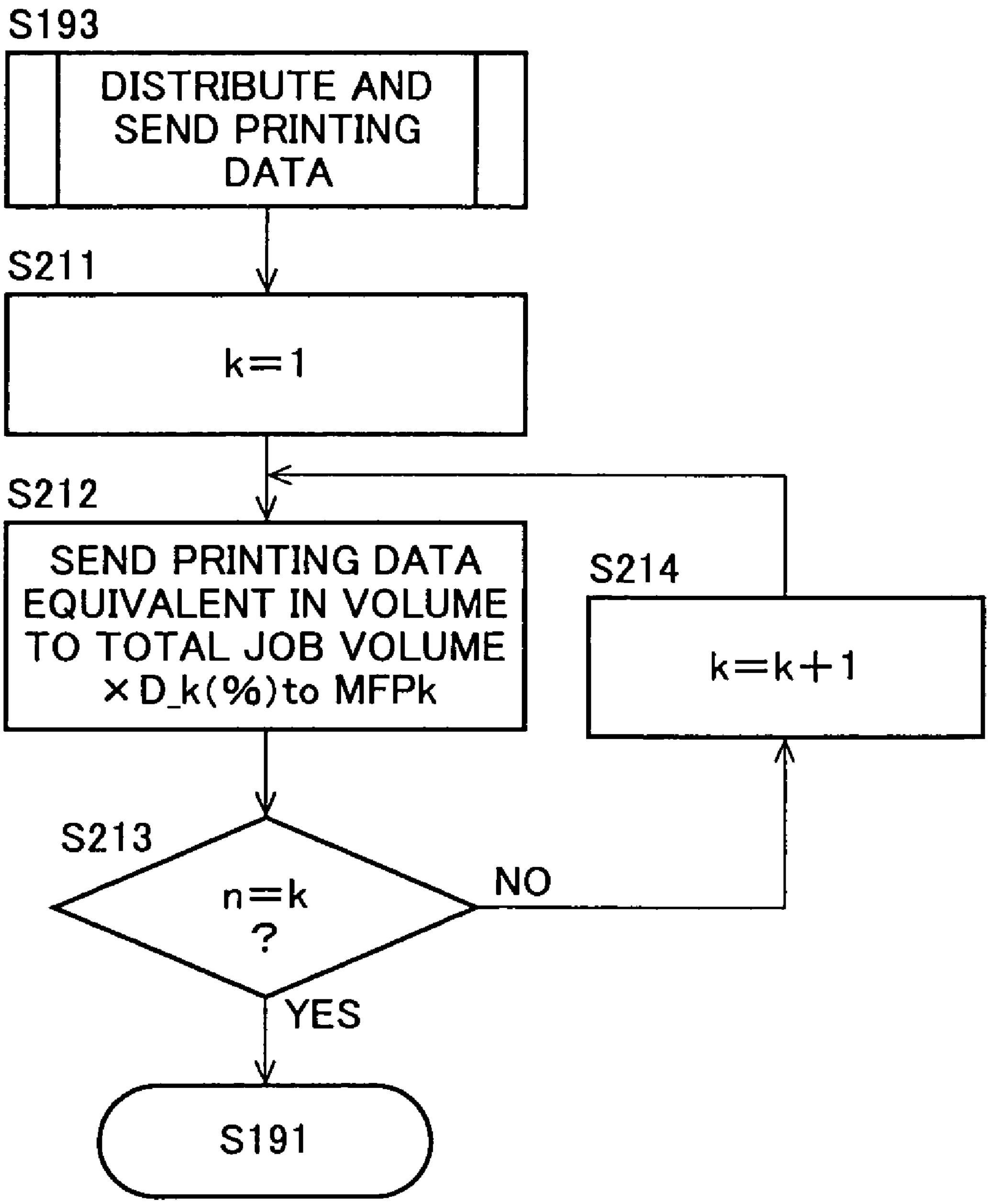
FIG. 31 is a flowchart showing the details of the step (S193) distributing and sending printing data to a multifunction printer specified by a user.

FIG. 31 is a flowchart showing the details of the step (S193) of distributing and sending printing data to multifunction printers specified by a user.

An initial value 1 is substituted into the variable k for the total number n of multifunction printers that are the object of data distribution (step 211), and printing data equivalent in volume to total job volume×D_k (%) is sent to a multifunction printer MFPk (step 212), and satisfaction of n=k is checked (step 213). If n=k is not satisfied at step 213, k+1 is substituted for k (step 214), and the calculation at step 212 is repeated. When n=k is satisfied at step 213 as the processes at steps 212, 214 are repeated (YES at step 213), a cycle of steps is ended.

Tenth Embodiment

Figure 32:
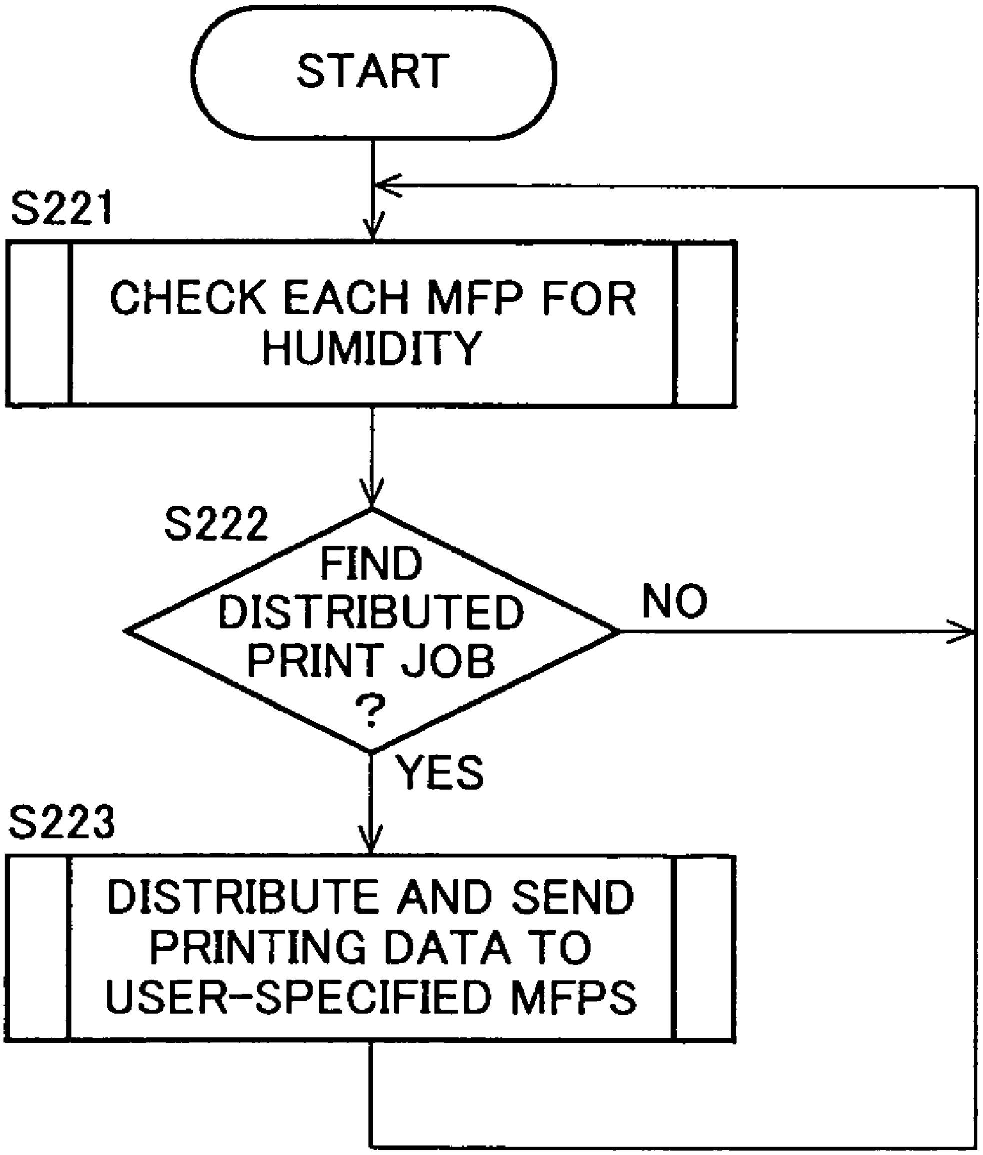
FIG. 32 is a flowchart depicting a process of distributing and sending printing data to each multifunction printer on the basis of the humidity state of the multifunction printer in the distributed printing system according to a tenth embodiment.

FIG. 32 is a flowchart depicting a process of distributing and sending printing data to each multifunction printer on the basis of the humidity state of the multifunction printer in the distributed printing system according to a tenth embodiment.

In the distributed printing system according to the tenth embodiment, the printing server checks each multifunction printer MFP for temperature information one after another, based on each piece of temperature information sent from each multifunction printer, to check the environmental state of each multifunction printer MFP (step 221). When a print job is sent from a personal computer or the like to the system via a network or the like (YES at step 222), the printing server distributes and sends printing data to user-specified multi-function printers MFP on the basis of the environmental state of each MFP that is checked at step 221 (step 223). When no print job is sent to the system at step 222, the printing server returns to step 221.

At step 223, the printing server distributes and sends the printing data to the user-specified multifunction printers MFP on the basis of the environmental state of each MFP. At this time, among the user-specified multifunction printers MFP, when a distribution coefficient Dk for a multifunction printer MFP having internal humidity of 30% or higher to 70% or lower is set to be 100, a distribution coefficient DSTR_k for a multifunction printer MFP having internal humidity of lower than 30% or over 70% is, for example, set to be 20 for data distribution. A multifunction printer MFP having internal humidity that is out of a range of 20 to 80% is made to carry out the interval printing as described later. Distribution coefficient DSTR_k is given as an approximate value, but the actual distribution coefficient can be calculated based on D_n=DSTR_n/ΣDSTR_k when the total number of multi-function printers for data distribution is set to be n.

Figure 33:
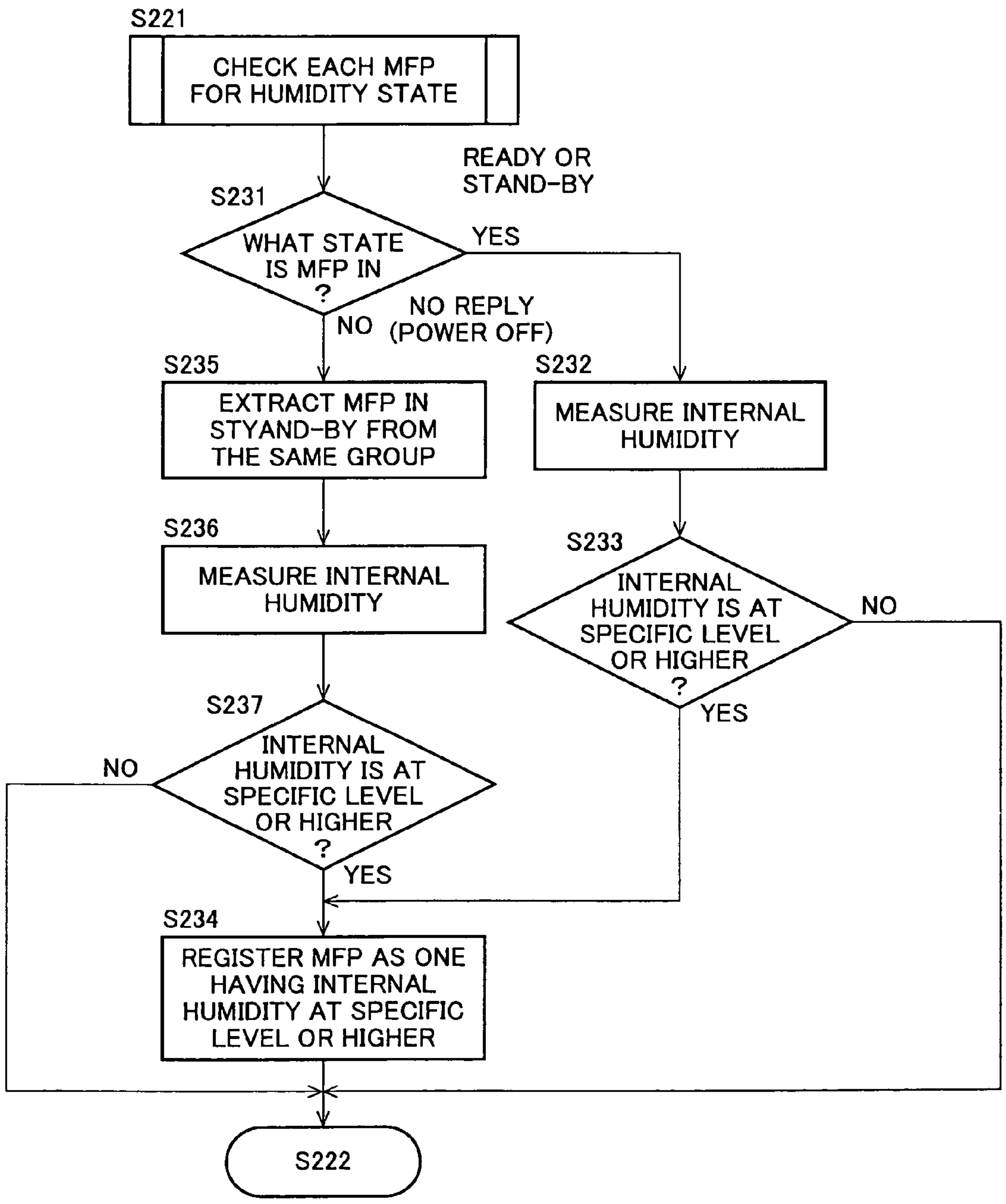
FIG. 33 is a flowchart showing the details of the step (S221) for checking each multifunction printer for the humidity state.

FIG. 33 is a flowchart showing the details of the step (S221) for checking each multifunction printer for the humidity state.

In the process at step 221 for checking the humidity state of each multifunction printer MFP, the printing server checks each multifunction printer MFP to see if the multifunction printer MFP is in the ready state or in the stand-by state, or is incapable of replying to the printing server (is not in the ready state) because of no power supply or other reasons (step 231). At step 231, when the multifunction printer MFP is in the ready state or stand-by state (YES at step 231), the printing server acquires humidity information including measurement of internal humidity from the multifunction printer MFP (step 232), and judges whether or not the multifunction printer MFP satisfies the condition indicated by the range of the operational environment condition shown in FIG. 2 (30% or higher to 70% or lower) on the basis of the humidity information (step 233). If the multifunction printer MFP satisfies the above condition (YES at step 233), the printing server registers the multifunction printer MFP as one that satisfies the given operational environmental condition (step 234), and proceeds to step 222 shown in FIG. 32. If the multifunction printer MFP does not satisfy the given operational environmental condition (NO at step 233), the printing server proceeds directly to step 222 shown in FIG. 32.

At step 231, when the multifunction printer MFP does not reply to the printing server because of no power supply or other reasons, (NO at step 231), the printing server picks out another multifunction printer MFP that is in the ready or stand-by state and belongs to the same group as the non-replying multifunction printer MFP (step 235), acquires humidity information from the picked multifunction printer MFP (step 236), and judges whether or not the picked multifunction printer MFP satisfies the humidity condition that is based on the operational environment condition range shown in FIG. 2 (step 237). If the picked multifunction printer MFP satisfies the humidity condition (YES at step 237), the printing server registers the picked multifunction printer MFP as one that satisfies the given operational environment condition (step 234), and proceeds to step 222 shown in FIG. 32. If the picked multifunction printer MFP does not satisfy the humidity condition at step 237, the printing server proceeds directly to step 222 shown in FIG. 32.

Figure 34:
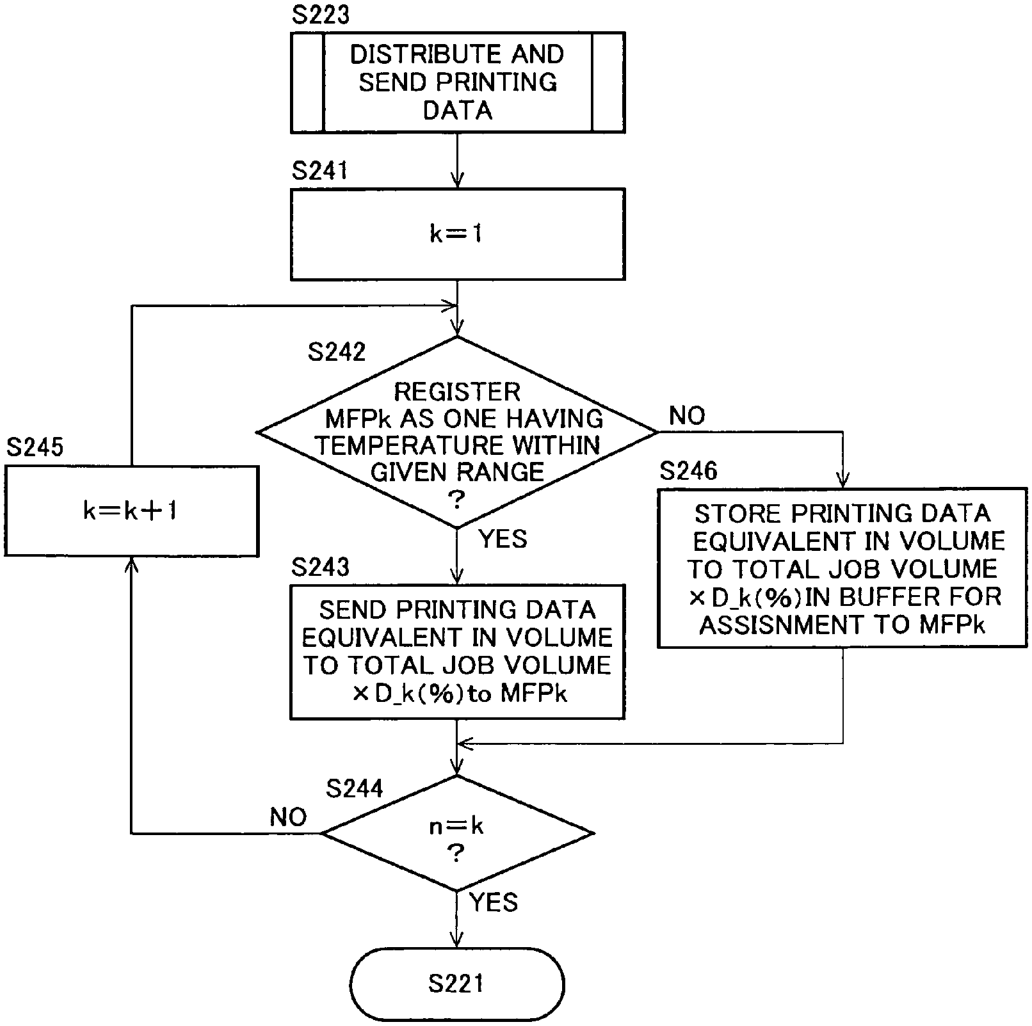
FIG. 34 is a flowchart showing the details of the step (S223) of distributing and sending printing data to multifunction printers specified by a user.

FIG. 34 is a flowchart showing the details of the step (S223) of distributing and sending printing data to multifunction printers specified by a user.

An initial value 1 is substituted into the variable k for the total number n of multifunction printers that are the object of data distribution (step 241), and a multifunction printer MFPk is checked to see if its humidity is within the given range or not (step 242), and printing data equivalent in volume to total job volume×D_k (%) is sent to the multifunction printer MFPk (step 243), and then satisfaction of n=k is checked (step 244). If n=k is not satisfied at step 244, k+1 is substituted for k (step 245), and the calculation at steps 242, 243 is repeated. When n=k is satisfied at step 244 as the processes at steps 242, 243 are repeated (YES at step 244), a cycle of steps is ended.

At step 242, when the multifunction printer MFPk is registered as one that has humidity out of the given range, the printing data of the total job volume×D_k (%) in size is stored in the buffer in the printing server for later execution of interval printing by the multifunction printer MFPk (step 246). Subsequently, satisfaction of n=k is checked (step 244), and, when n=k is not satisfied at step 244, k+1 is substituted into k (step 245), then the process flow returns to step 242.

Figure 35:
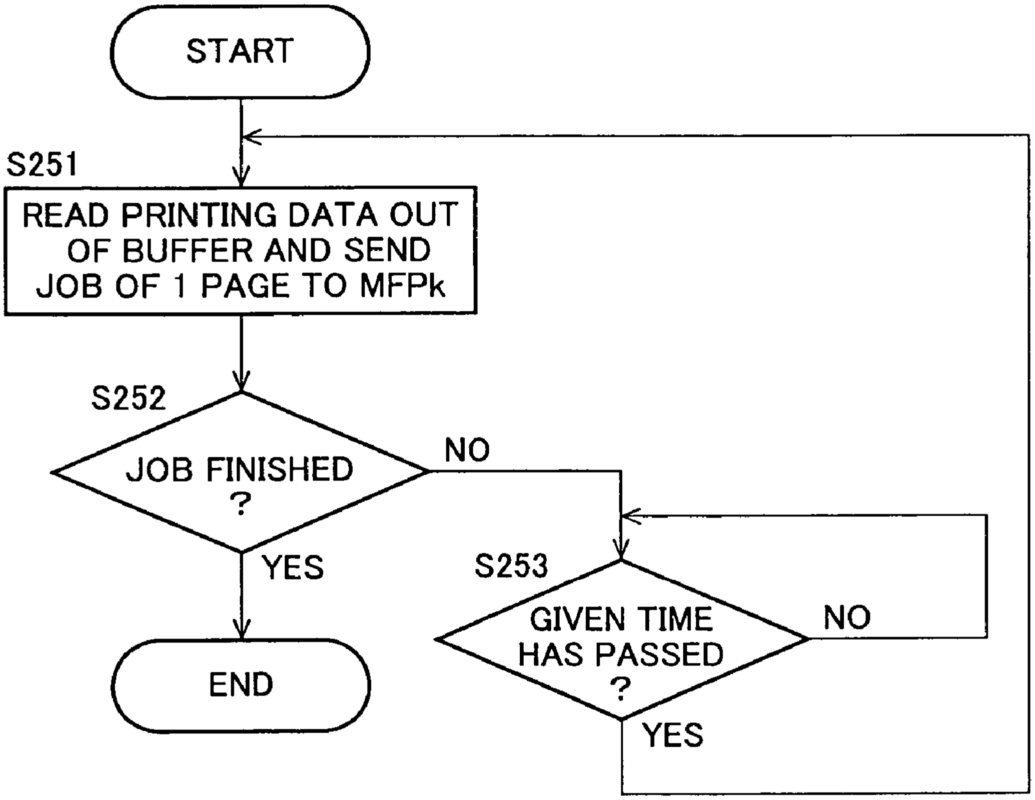
FIG. 35 is a flowchart depicting a process that a multifunction printer carries out interval printing.

FIG. 35 is a flowchart depicting a process executed when a multifunction printer carries out interval printing.

As described before, a multifunction printer MFP having the internal humidity that is out of the range of 20 to 80% is made to carry out interval printing, which reduces printing load, in order to prevent an operational failure during printing operation. At step 246 shown in FIG. 34, the printer server reads the printing data of the total job volume×D_k (%), the data the server has stored for the multifunction printer MFPk, out of the buffer in the server, and sends the printing data to the multifunction printer MFPk for the execution of a job of 1 page in volume (step 251). The printer server then checks to see if the job is finished or not (step 252). If the job is not finished, the printer server checks to see if the given time has passed or not (step 253), and returns to step 251 after the given time has passed to process the next job.

The present invention provides the following result.

The present invention provides a printing system comprising a printing server and a number of image forming devices, the printing server and the image forming devices being connected via a network, and a printing control method for the printing system. Each image forming device has an operational environment acquiring means for acquiring operational environment information and an operational environment information sending means for sending the acquired operational environment information to the printing server. The printing server judges the state of each image forming device on the basis of the operational environment information sent from the operational environment information sending means, and controls the operation of each image forming device on the basis of a resulted judgment. This prevents such a trouble that a bedewed image forming device starts printing first, or that a bedewed image forming device brings printing operation into a stand-by state upon receiving a printing request.

Each image forming device sends the printing server temperature information and humidity information derived from an installation environment for the image forming device. In response, the printing server exclusively judges whether or not bedewing is in progress on each image forming device. This allows highly reliable judgment on bedewing on the basis of a uniform criterion for judgment, prevents such a trouble of a bedewed image forming device's starting printing, or of bringing printing operation into a stand-by state, thus enables the execution of printing constantly high in quality.

Each image forming device has an operational state information sending means for sending operational state information to the printing server, and a control means of the printing server controls each image forming device on the basis of the operational state information. This allows the control means of the printing server to refer to the operational state of each image forming device, such as being in the ready state for printing, or being under a given temperature with a fixing device on operation, and, for example, to judge that an image forming device cleared bedewing when a given time has passed since the device became to be in the ready state. Hence a low-cost printing system and a print control method can be provided using a judging means of a simple structure.

A plurality of image forming devices are classified into groups. When the control means of the printing server cannot acquire environmental information from one image forming device in a group, the control means of the printing server acquires environmental information from another image forming device in the same group, and judges the state of another image forming device. This enables the system to carry out printing using an image forming device predetermined as a substitutive image forming device even if one image forming device in the group cannot be used.

Upon judging an image forming device to be not in a given operational environment, the control means of the printing server changes control over the image forming device to reduce load thereon, and then sends printing data to the image forming device. This makes the image forming device operable temporarily when the operational environment of the installation location of the image forming device does not differ widely from the given operational environment, thus enables use of a maximum number of image forming devices in a broader operational environment.

Each image forming device has a means for changing operational environment, such as a bedewing preventive means. Upon judging an image forming device to be not in the given operational environment, the control means of the printing server actuates the means for changing operational environment, and sends printing data to the image forming device after an operational environment for the image forming device has been turned into the given operational environment. In this manner the control means makes forcibly even an image forming device which is not in an operational environment into an operable image forming device, therefore a maximum number of image forming devices can be used in a broader operational environment.

Upon judging an image forming device to be in a bedewing state, the control means of the printing server sends a bedewing clearing signal for actuating the bedewing preventive means, which is the means for changing operational environment, to the image forming device, and judges that the image forming device cleared bedewing when a given time has passed since a bedewing preventive mechanism was started. This makes it possible to actuate only the bedewing preventive device of the image forming device in need and to reduce power consumption, therefore, the image forming device can be put into the state of capable of printing immediately after bedewing is cleared.

The control means of the printing server judges whether or not each image forming device is in the given operational environment in consideration of the history of an operational environment for each image forming device. The control means of the printing server, therefore, can judge the state of each image forming device accurately in consideration of the history of temperature and humidity as well as of the present temperature and humidity when the operational environment for the image forming device fluctuates, and control the image forming device accurately on the basis of the results of the judgment.

According to the present invention, each of image forming devices connected to the network acquires each operational environment information and sends the information to the printing server, which in response judges the state of each of the image forming devices on the basis of the operational environment information sent to the printing server, and decides an assignment of an amount of a distributed printing job to be sent to each of the image forming devices on the basis of the results of the judgment. The environmental conditions of the image forming devices connected to the network, therefore, are judged with a uniform criterion in a highly reliable manner. This prevents such a trouble that a bedewed image forming device or an image forming device not satisfying the given operational environment condition starts printing first or brings printing operation into a stand-by state upon receiving a distributed printing request, thus enables the execution of highly efficient distributed printing using image forming devices as many as possible.

The printing server analyzes environmental information of the installation location of each image forming device, which is measured by each image forming device, and instructs image forming devices in the bedewing state to clear bedewing. The printing server then estimates times the image forming devices in the bedewing state take to clear bedewing, and also estimates times the image forming devices take to finish respective print jobs when the image forming devices execute printing after clearing themselves of bedewing, then assigns a distributed print job to each image forming device in specific amount to each device so that a time each image forming device takes to finish the assigned print job coincides. This allows every operable image forming device to be used for distributed printing to process a large volume of print jobs in the shortest time and carry out highly efficient distributed printing.

The printer server acquires the temperature of the installation environment of each image forming device as operational environment information, and reduces an amount of printing data sent as an assigned job to an image forming device that is in an installation environment having a temperature lower than a given temperature. Because of this, the image forming device can finish the print job before a fixing temperature drops even if the image forming device is in the state that makes the fixing temperature of a fixing device easy to drop.

The printer server acquires the humidity of the installation environment of each image forming device as operational environment information, and controls an image forming device that is in an installation environment having humidity out of a given humidity range so that the image forming device carries out printing work for every recording medium one by one. As a result, in case an operational jam occurs in the device, only one paper is to be ejected out of the device, which facilitates restoration work.

The invention claimed is:

1. A printing server in a distributed printing system comprising: a plurality of image forming devices; and a printing server, when a print job is generated, assigning print data to be sent to the plurality of image forming devices and carrying out distributed printing, and for at least each of the plurality of image forming devices, acquiring operational environment information including presence/absence of generating of bedewing, whether in a ready state (state where a fixing device is operable) or a standby state (state in a power saving mode where a fixing device is not electrified), a duration time of the ready state, a time that has passed at a temperature and humidity other than bedewing generating conditions, and an operation time of a dehumidification device, when a print job is generated, determining presence/absence of generating of bedewing on the basis of the operational environmental information, assigning a distributed job to be sent to the image forming device determined as not generating bedewing, and also for an image forming device in which bedewing is generated, estimating the shortest time taken to clear bedewing, and when the time has passed, assigning a distributed job to be sent.

2. The printing server of claim 1, wherein an assignment of a distributed print job to be sent to each of the image forming devices is performed so that each image forming device to which the distributed print job is assigned finishes printing at the same time.

3. The printing server of claim 1 or 2, wherein an estimation of a shortest time taken to clear bedewing on the basis of the operational environment information is performed by any one of a time that has passed at a temperature and humidity other than bedewing generating conditions, a time that has passed since starting a ready state, and an operation time of a dehumidification device.

4. An assigning method of a print job in a distributed printing system, comprising: a plurality of image forming devices; and a printing server, when a print job is generated, assigning print data to be sent to the plurality of image forming devices and carrying out distributed printing, wherein the printing server, for at least each of the plurality of image forming devices acquires operational environment information including presence/absence of generating of bedewing, whether in a ready state (state where a fixing device is operable) or a standby state (state in a power saving mode where a fixing device is not electrified), a duration time of the ready state, a time that has passed at a temperature and humidity other than bedewing generating conditions, and an operation time of a dehumidification device, when a print job is generated, determines presence/absence of generating of bedewing on the basis of the operational environmental information, assigns a distributed job to be sent to the image forming device determined as not generating bedewing, and also for an image forming device in which bedewing is generated, estimates the shortest time taken to clear bedewing, and when the time has passed, assigns a distributed job to be sent.

5. The assigning method of a print job of claim 4, wherein an assignment of a print job to be sent to each of the image forming devices is performed so that each image forming device to which the print job is assigned finishes printing at the same time.

6. A non-transitory computer readable storage medium upon which is stored a printing control program for causing a computer to execute the assigning method of a print job of the claim 4.

* * * * *